United States Patent
Okumura et al.

Patent Number: 5,814,899
Date of Patent: Sep. 29, 1998

[54] SOI-TYPE SEMICONDUCTOR DEVICE WITH VARIABLE THRESHOLD VOLTAGES

[75] Inventors: Koichiro Okumura; Susumu Kurosawa, both of Tokyo, Japan

[73] Assignee: NEC Corporation, Tokyo, Japan

[21] Appl. No.: 812,974

[22] Filed: Mar. 5, 1997

Related U.S. Application Data

[62] Division of Ser. No. 592,635, Jan. 26, 1996.

[30] Foreign Application Priority Data

Jan. 27, 1995 [JP] Japan ................... 7-031348

[51] Int. Cl.⁶ .......................................... G05F 1/10
[52] U.S. Cl. ..................... 307/64; 257/901; 327/530; 327/534; 327/535
[58] Field of Search ................... 307/64, 66; 327/530, 327/537, 538, 543, 535, 534; 257/288, 901; 361/78, 79

[56] References Cited

U.S. PATENT DOCUMENTS

| | | | |
|---|---|---|---|
| 4,956,563 | 9/1990 | Schornack | 307/66 |
| 5,278,102 | 1/1994 | Horie | 438/164 |
| 5,280,455 | 1/1994 | Kanaishi | 307/64 |
| 5,394,017 | 2/1995 | Catano et al. | 307/66 |
| 5,473,277 | 12/1995 | Furumochi | 327/543 |
| 5,497,023 | 3/1996 | Nakazato et al. | 257/394 |
| 5,506,540 | 4/1996 | Sakurai et al. | 327/535 |
| 5,555,151 | 9/1996 | Baker et al. | 361/78 |

FOREIGN PATENT DOCUMENTS

| | | |
|---|---|---|
| 0564204A2 | 10/1993 | European Pat. Off. . |
| 60-10656 | 1/1985 | Japan . |
| 4302897 | 10/1992 | Japan . |
| 5-121681 (A) | 5/1993 | Japan . |
| 6-21443 (A) | 1/1994 | Japan . |
| 621443 | 1/1994 | Japan . |
| 6-216346 (A) | 8/1994 | Japan . |
| 6-243687 (A) | 9/1994 | Japan . |
| 06295921 A | 10/1994 | Japan . |
| A-8-17183 | 1/1996 | Japan . |

Primary Examiner—Jeffrey A. Gaffin
Assistant Examiner—Albert W. Paladini
Attorney, Agent, or Firm—Whitham, Curtis & Whitham

[57] ABSTRACT

In an SOI-type semiconductor device, a power supply voltage is applied to back gates of P-channel MOS transistors in a standby mode, and a voltage lower than the power supply voltage is applied to the back gates of the P-channel MOS transistors in an active mode. A ground voltage is applied to back gates of N-channel MOS transistors in the standby mode, and a voltage higher than the ground voltage is applied to the back gates of the N-channel MOS transistors in an active mode.

14 Claims, 25 Drawing Sheets

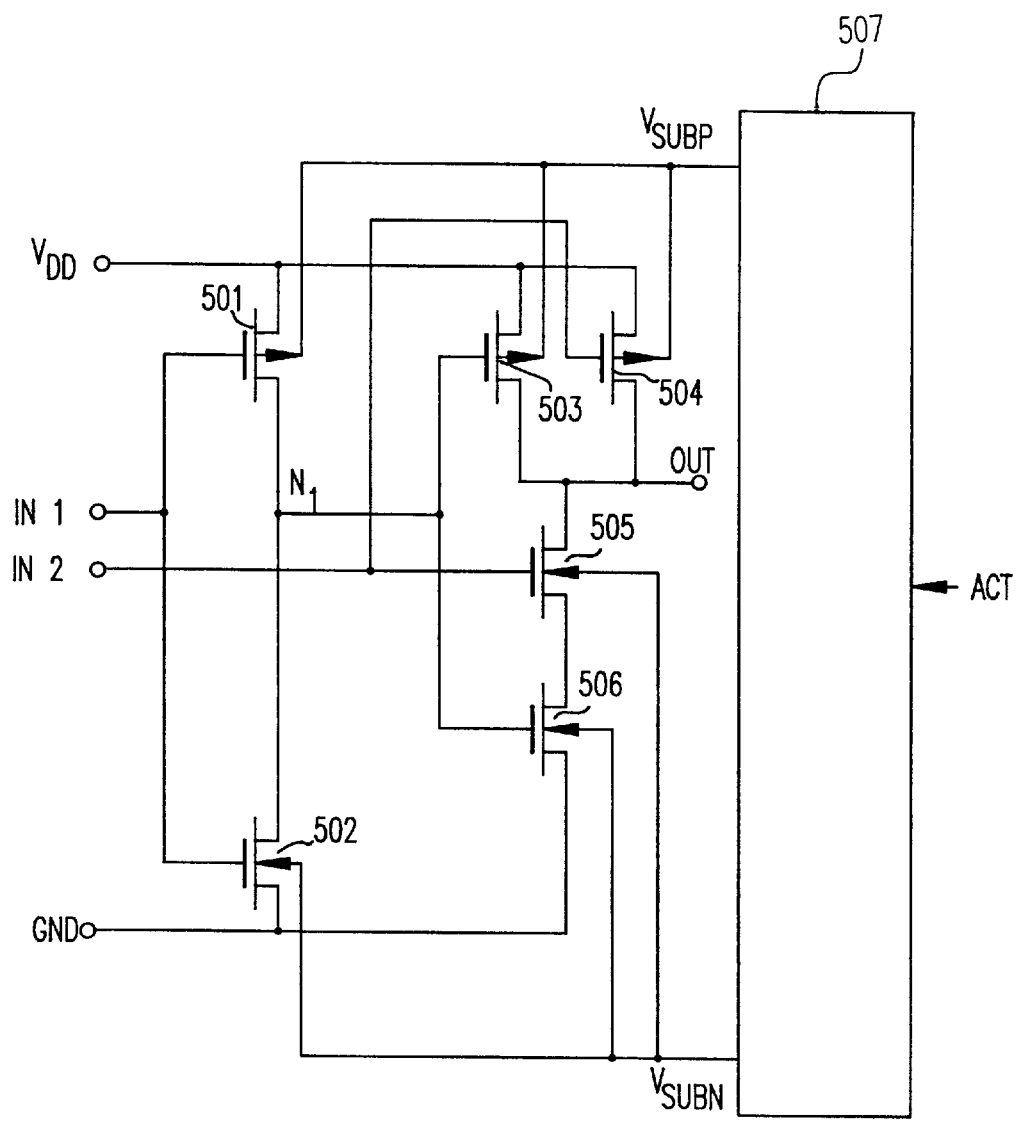
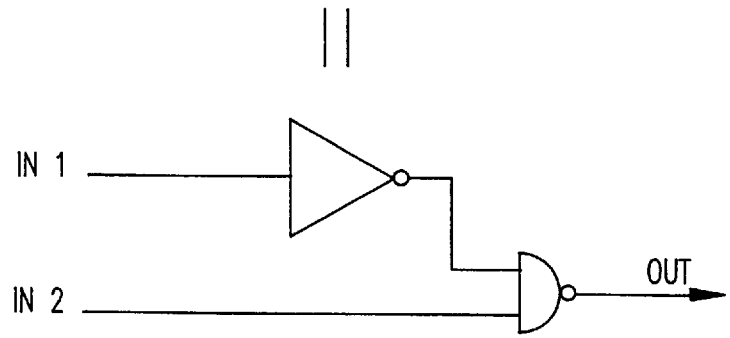
FIG.5

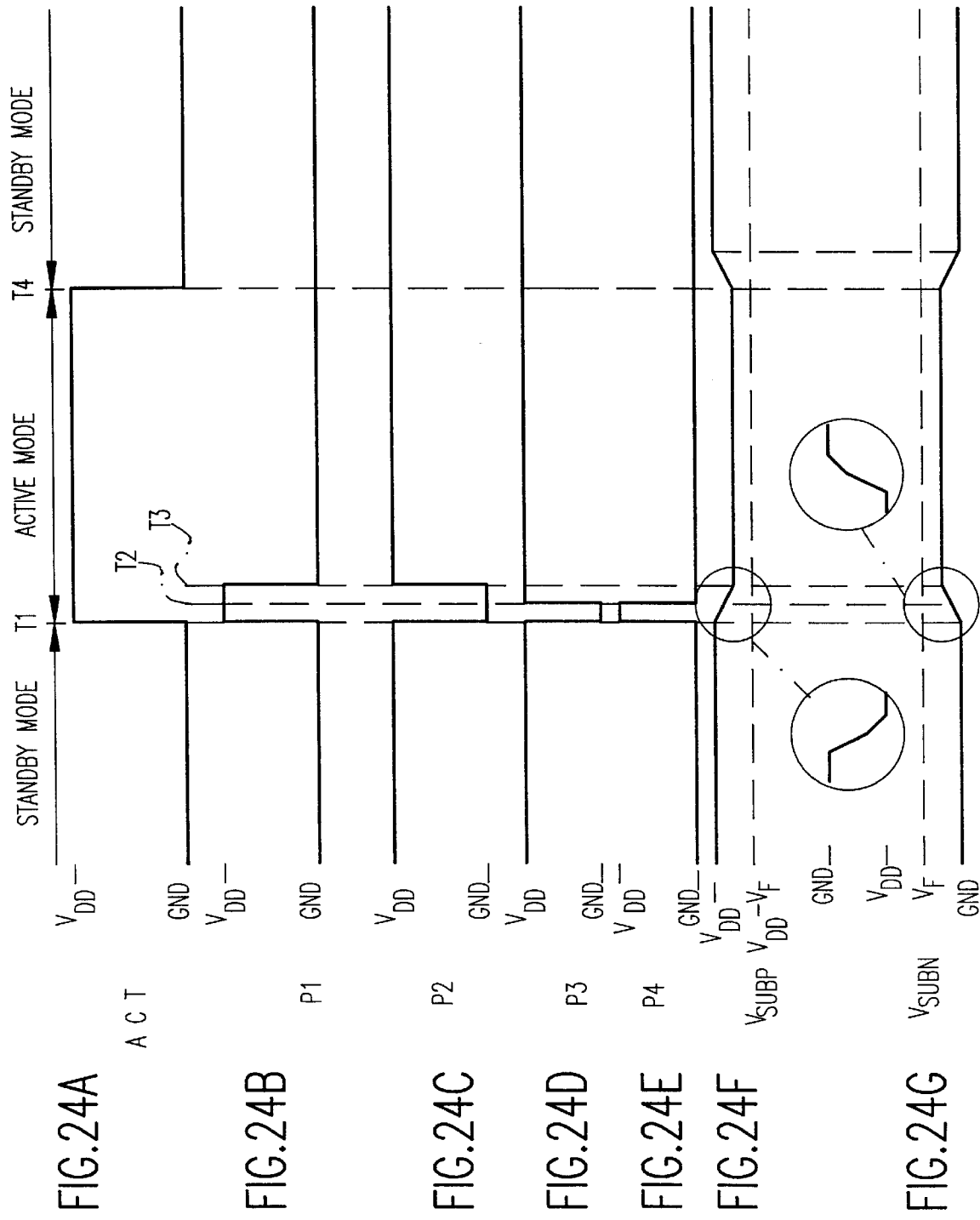

SOI-TYPE SEMICONDUCTOR DEVICE WITH VARIABLE THRESHOLD VOLTAGES

This is a Divisional Application of application Ser. No. 08/592,635 filed Jan. 26, 1996.

BACKGROUND OF THE INVENTION

1. Field of the Invention

The present invention relates to a silicon-on-insulator (SOI)-type semiconductor device.

2. Description of the Related Art

Portable electronic apparatus have required less power dissipation, and therefore, the a power supply voltage for integrated circuits in such apparatuses has been lowered. However, the lower the power supply voltage, the lower the operation speed.

For example, in an N-channel MOS gate circuit, the operation speed is approximately in proportion to $$(V_{DD}-V_{th})^2$$

where $V_{DD}$ is a power supply voltage; and $V_{th}$ is a threshold voltage of a MOS transistor.

Therefore, when the power supply voltage is lowered without changing the threshold voltage, the operation speed is rapidly lowered. Conversely, when the power supply voltage is lowered simultaneously with the lowering of the threshold voltage, a sub threshold current is increased so that the power dissipation in a standby mode is increased.

In a first prior art semiconductor device, in an active mode, a power supply voltage $V_{DD}$ is applied to back gates of P-channel MOS transistors, and a ground voltage is applied to back gates of N-channel MOS transistors, so as to increase the operation speed with the increase of the power dissipation. Conversely, in a standby mode, a voltage higher than the power supply voltage is applied to the back gates of the P-channel MOS transistors, and a negative voltage is applied to the back gates of the N-channel MOS transistors. Therefore, the absolute values of threshold voltages of the P-channel MOS transistors and the N-channel MOS transistors are increased so as to reduce the power dissipation with the lowering of the operation speed (see JP-A-4-302897).

In the first prior art semiconductor device, however, since charge pump circuits are required to generate the voltage higher than the power supply voltage and the negative voltage in a standby mode, the effect of reduction of the power dissipation in the standby mode is compensated for by the power dissipation of the charge pump circuits. Thus, a substantial power reduction cannot be expected.

In a second prior art semiconductor device, in an active mode, a shallow negative voltage is applied to a back gate of an N-channel MOS transistor, so as to increase the operation speed with the increase of the power dissipation. Conversely, in a standby mode, a deep negative voltage is applied to the back gate of the N-channel MOS transistor, to raise the threshold voltage thereof, thus reducing the power dissipation with the lowering of the operation speed (see JP-A-60-10656).

Also, in the second prior art semiconductor device, since charge pump circuits are required to generate the shallow and deep negative voltages, the effect of reduction of the power dissipation in the standby mode is compensated for by the power dissipation of the charge pump circuits. Thus, a substantial power reduction cannot be also expected.

In a third prior art semiconductor, in an active mode, a voltage lower than a power supply voltage is applied to a back gate of a P-channel MOS transistor, and a positive voltage is applied to a back gate of an N-channel MOS transistor, so as to increase the operation speed with the increase of the power dissipation. Conversely, in a standby mode, the power supply voltage is applied to the back gates of the P-channel MOS transistors, and the ground voltage is applied to the back gates of the N-channel MOS transistors. Therefore, the absolute values of threshold voltages of the P-channel MOS transistors and the N-channel MOS transistors are increased so as to reduce the power dissipation with the lowering of the operation speed (see JP-A-6-21443).

Thus, in the above-described third prior art semiconductor device, since charge pump circuits are unnecessary, the power dissipation can be expected.

However, when the above-described third prior art semiconductor device is applied to a conventional CMOS device, the following problems occur. First, a short-circuit is generated between a well and a substrate, and accordingly, it is impossible to control the threshold voltages. Also, in a large scale semiconductor device, a large parasitic capacitance is generated between the well and the substrate. Therefore, when the control is transferred from a standby mode to an active mode or vice versa, the large parasitic capacitance needs to b charged or discharged, which requires a long transition time. This will be also explained later in detail.

SUMMARY OF THE INVENTION

It is an object of the present invention to provide a semiconductor device capable of changing threshold voltages between an active mode and a standby mode without charge pump circuits.

Another object is to provide a low power dissipation bias voltage generating apparatus.

According to the present invention, in an SOI-type semiconductor device, a power supply voltage is applied to back gates of a P-channel MOS transistors in a standby mode and a voltage lower than the power supply voltage is applied to the back gates of the P-channel MOS transistors in an active mode. A ground voltage GND is applied to back gates of P-channel MOS transistors in a standby mode and a voltage lower than the power supply voltage is applied to the back gates of the P-channel MOS transistors in an active mode. In the SOI semiconductor device, since the transistors are electrically isolated from a substrate, no short-circuit is generated between the transistors (well) and the substrate. Also, since no substantial parasitic capacitance exists between the transistors (well) and the substrate, a transition time from a standby mode to an active mode or vice versa can be reduced.

BRIEF DESCRIPTION OF THE DRAWINGS

The present invention will be more clearly understood from the description as set forth below, as compared with the prior art, with reference to the accompanying drawings, wherein:

FIG. 5 is a circuit diagram illustrating a logic circuit to which the first embodiment of FIG. 4 is applied;

FIGS. 24A through 24G are timing diagrams for explaining the operation of the bias voltage generating circuit of FIG. 23.

DESCRIPTION OF THE PREFERRED EMBODIMENTS

Before the description of the preferred embodiments, a prior art semiconductor device will be explained with reference to FIGS. 1, 2, 3A and 3B.

Figure 1:
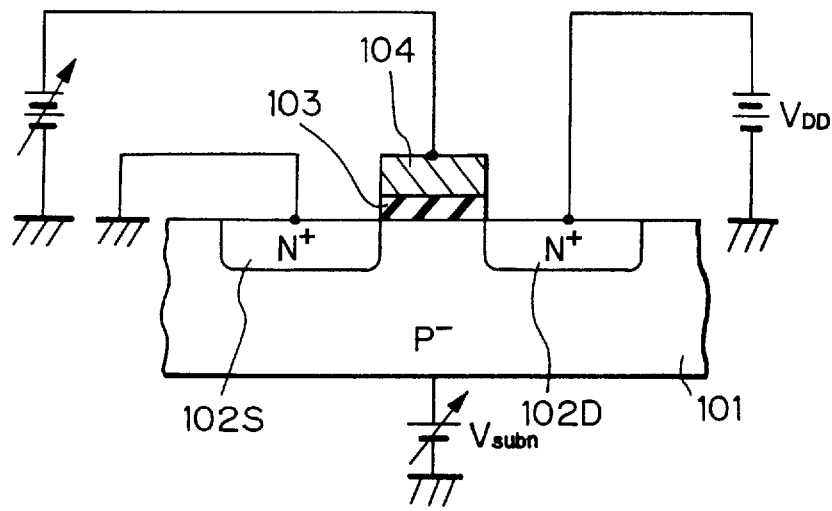
FIG. 1 is a cross-sectional view illustrating a prior art N-channel MOS transistor.

In FIG. 1, reference numeral 101 designates a P⁻-type monocrystalline silicon substrate in which an N⁺-type impurity source region 102S and an N⁺-type impurity drain region 102D are formed. Also, a gate silicon oxide layer 103 is formed between the source region 102S and the drain region 102D, and a gate electrode 104 made of polycrystalline silicon is formed thereon.

The source region 102S is grounded, and a power supply voltage $V_{DD}$ is applied to the drain region 102D. Also, a substrate voltage $V_{subn}$ is applied to the substrate 101.

Here, if the device of FIG. 1 is an enhancement type N-channel MOS transistor, when a positive voltage is applied to the gate electrode 104, a channel is created in the substrate 101 between the source region 102S and 102D. As a result, when a positive current of about 1 μA flows from the drain region 102D to the source region 102S, such a positive voltage is called a threshold voltage $V_{thn}$.

Figure 2:
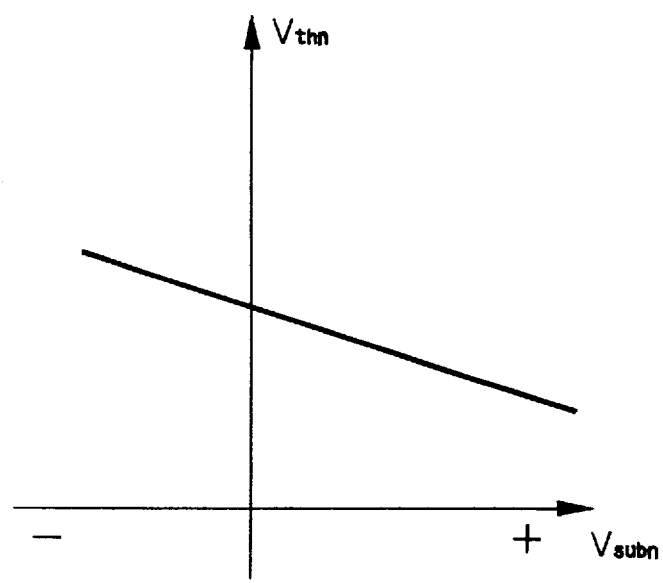
FIG. 2 is a graph showing a relationship between a back gate voltage and a threshold voltage of the N-channel MOS transistors of FIG. 1.

The threshold voltage $V_{thn}$ is dependent upon a back gate voltage, i.e., the substrate voltage $V_{subn}$, as shown in FIG. 2. That is, the higher the substrate voltage $V_{subn}$, the lower the threshold voltage $V_{thn}$. Therefore, in an active mode, the substrate voltage $V_{subn}$ is positive to lower the threshold voltage $V_{thn}$, so that the operation speed is increased and the power dissipation is increased. On the other hand, in a standby mode, the substrate voltage $V_{subn}$ is zero to raise the threshold voltage $V_{thn}$, so that the sub threshold current is decreased to decrease the power dissipation and the operation speed is decreased.

Figure 3A:
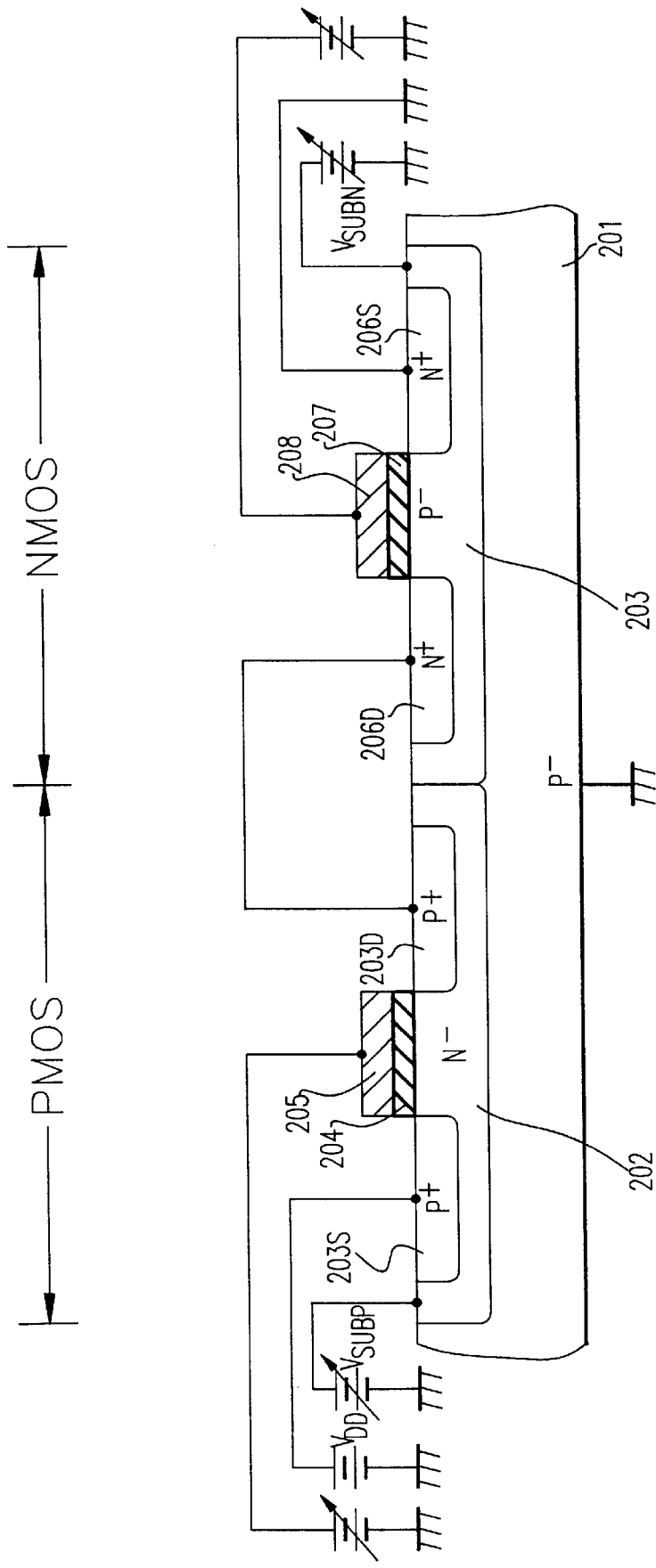
FIGS. 3A and 3B are cross-sectional views illustrating prior art CMOS devices to which the device of FIG. 1 is applied.

In FIG. 3A, which is a cross-sectional view illustrating a CMOS device to which the device of FIG. 1 is applied, reference numeral 201 designates a P⁻-type monocrystalline silicon substrate having an N⁻-type well 202 and a P⁻-type well 203 therein. Formed in the N⁻-type well 202 are a P⁺-type source region 203S and a P⁺-type impurity drain region 203D. Also, a gate silicon oxide layer 204 is formed between the source region 203S and the drain region 203D, and a gate electrode 205 made of polycrystalline silicon is formed thereon.

On the other hand, formed in the P⁻-type well 203 are an N⁺-type impurity source region 206S and an N⁺-type impurity drain region 206D. Also, a gate silicon oxide layer 207 is formed between the source region 206S and the drain region 206D, and a gate electrode 208 made of polycrystalline silicon is formed thereon.

In FIG. 3A, the substrate 201 is grounded. Also, the power supply voltage $V_{DD}$ is applied to the source region 203S, and the source region 206S is grounded. The drain region 203D is connected to the drain region 206D. A substrate voltage $V_{subp}$ is applied to the N⁻-type well 202, and a substrate voltage $V_{subn}$ is applied to the P⁻-type well 203.

In an active mode, the substrate voltage $V_{subp}$ is lower than the power supply voltage $V_{DD}$ to lower the absolute value of the threshold voltage $V_{thp}$ of the P-channel transistor, and the substrate voltage $V_{thn}$ is positive to lower the threshold voltage $V_{thn}$, so that the operation speed is increased and the power dissipation is increased. On the other hand, in a standby mode, the substrate voltage $V_{subp}$ is $V_{DD}$ to raise the absolute value of the threshold voltage $V_{thp}$, and the substrate voltage $V_{thn}$ is zero to raise the threshold voltage $V_{thn}$, so that the sub threshold current is decreased to decrease the power dissipation and the operation speed is decreased.

Note that, if a semiconductor device is divided into a plurality of blocks which can operate individually, switching control of an active mode and a standby mode is performed upon the blocks individually.

In FIG. 3A, in a standby mode, the P⁻-well 203 is short-circuited to the substrate 201, so that the entirety of the semiconductor device (chip) is supplied with the same potential as that of the P⁻-type well 203. Thus, it is impossible to switch the blocks individually from an active mode to a standby mode or vice versa.

Figure 3B:
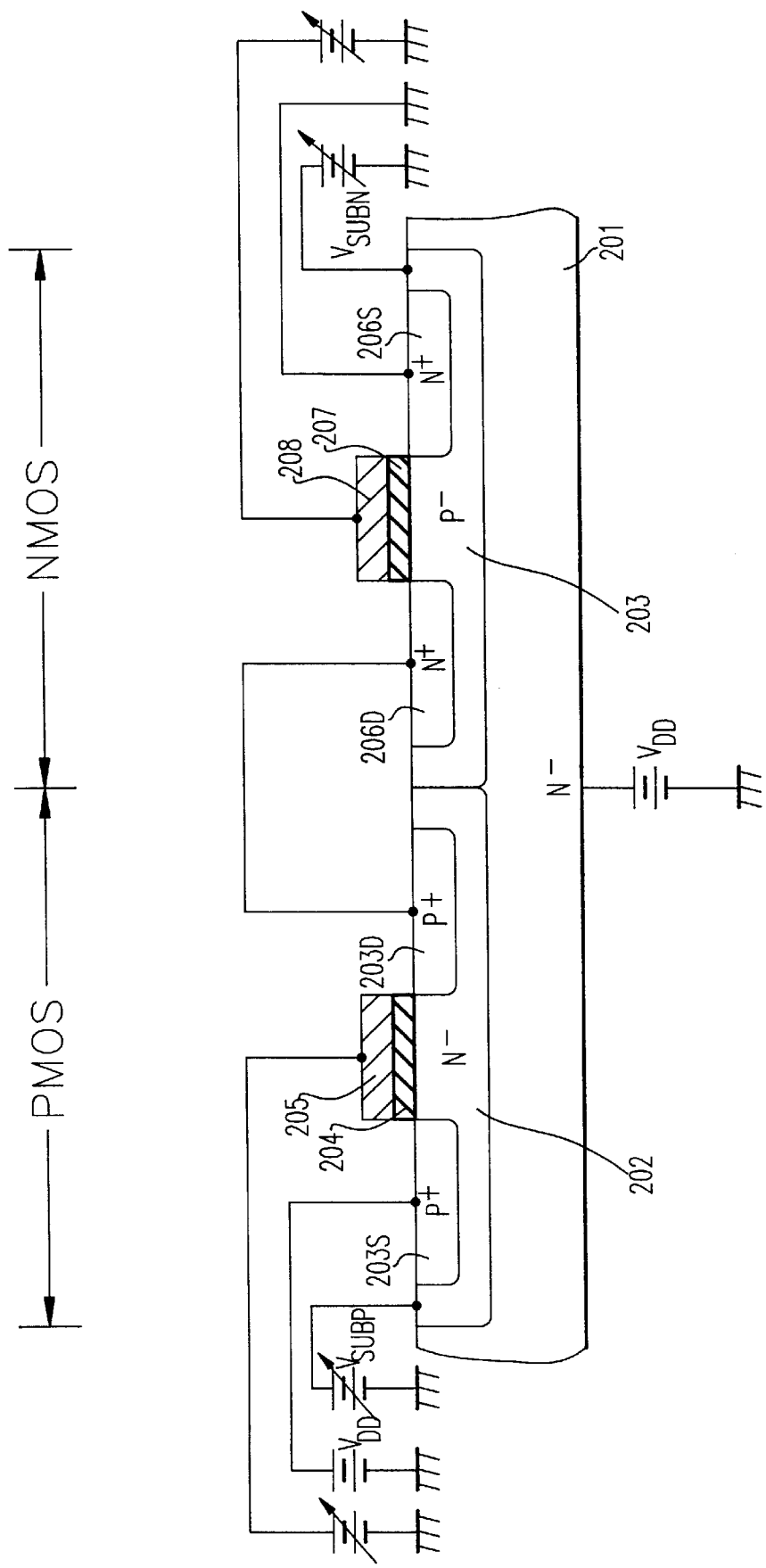

Note that, as illustrated in FIG. 3b, if the substrate 201 is of an N⁻-type, the power supply voltage $V_{DD}$ is applied to the substrate 201. Therefore, in a standby mode, the N⁻-well 202 is short-circuited to the substrate 201, so that the entirety of the semiconductor device (chip) is supplied with the same potential as that of the N⁻-type well 202. Thus, it is also impossible to switch the blocks individually from an active mode to a standby mode or vice versa.

Also, in FIG. 3A, there is a large parasitic capacitance between the P⁻-type substrate 201 and the N⁻-type impurity region 202. Similarly, in FIG. 3B, there is a large parasitic capacitance between the N-type substrate 201 and the P⁻-type impurity region 203. Therefore, when the control is transferred from a standby mode to an active mode or vice versa, the large capacitance needs to be charged or discharged, which requires a long transition time.

Particularly, in the semiconductor device divided into a plurality of blocks, a high speed transition from a standby mode to an active mode is required for each of the blocks. In a transcient state from the standby mode to the active mode in a block, it is impossible to operate the block, thus reducing the performance of the semiconductor device. For example, assume that the semiconductor device is comprised 1000000 gates under 0.35 μm design rule, and a substantial capacitance between the substrate and the P⁻-type or N⁻-type wells in about 22000 pF. In this case, if a bias voltage generating circuit having a current supplying capability of 1 mA is used, a transition time is about 11 μs and is remarkably larger than an instruction execution time such as 10 to 100 ns.

In FIGS. 3A and 3B, the substrate voltage $V_{subp}$ in an active mode is $$V_{DD}-V_F<V_{subp}<V_{DD}$$

where $V_V$ is a forward voltage of a PN junction formed by the P⁻-type impurity regions 203S and 203D and the N⁻-type well 202. Note that, if $V_{subp} \leq V_{DD}-V_F$, a forward current flows through this PN junction.

Similarly, in FIGS. 3A and 3B, the substrate voltage $V_{subn}$ in an active mode is $$0<V_{subn}<V_F$$

where $V_F$ is a forward voltage of a PN junction formed by the P⁻-type well 203 and the N⁺-type impurity regions 206S and 206D. Note that, if $V_{subn} \geq V_F$, a forward current flows through this PN junction.

Figure 4:
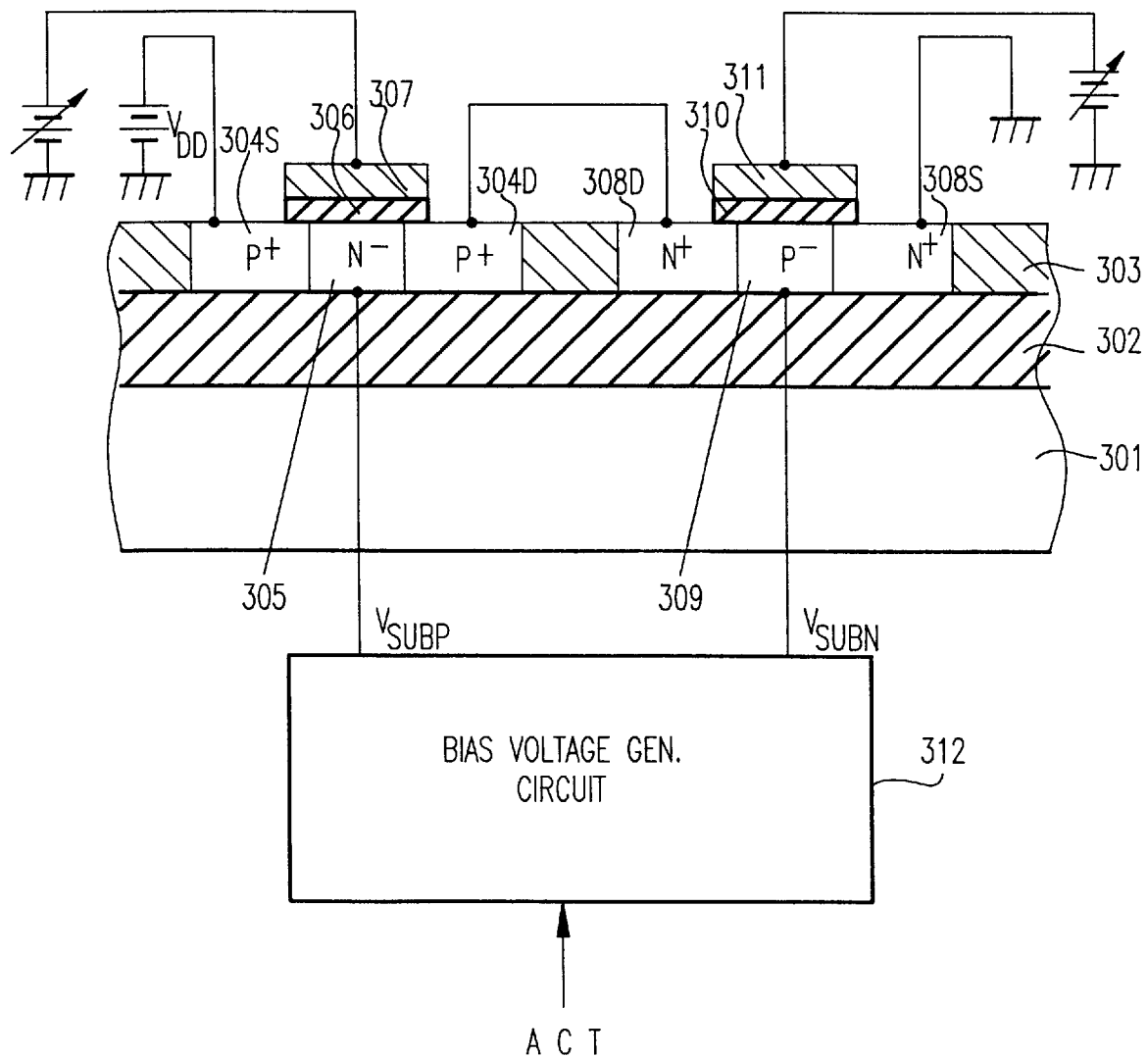
FIG. 4 is a cross-sectional view illustrating a first embodiment of the SOI-type semiconductor device according to the present invention.

In FIG. 4, which illustrates an embodiment of the present invention, reference numeral 301 designates a monocrystalline silicon substrate having a buried silicon oxide layer 302 thereon. Also, a monocrystalline silicon layer for a P-channel MOS transistor and a monocrystalline silicon layer for an N-channel MOS transistor are formed on the buried silicon oxide layer 302 and are electrically isolated from each other by a silicon oxide layer 303. This configuration is formed by using a separation by implanted oxygen (SIMOX) technology. That is, oxygen ions are implanted into a monocrystalline silicon substrate, and thereafter, a heating operation is performed thereupon, thus obtaining a silicon-on-insulator substrate.

In the monocrystalline silicon layer for the P-channel MOS transistor, a P⁻-type impurity source region 304S, a P⁺-type impurity drain region 304D and an N⁻-type back gate region 305 therebetween are formed. Also, a gate silicon oxide layer 306 is formed on the back gate region 305, and a gate electrode 307 made of polycrystalline silicon is formed on the gate silicon oxide layer 306. In this case, the source region 304S and the drain region 304D are in self-alignment with the gate electrode 307. Also, when a voltage is applied to the gate electrode 307, a channel is generated in the back gate region 305.

In the monocrystalline silicon layer for the N-channel MOS transistor, an N⁺-type impurity source region 308S, an N⁺-type impurity drain region 308D and a P⁻-type back gate region 309 therebetween are formed. Also, a gate silicon oxide layer 310 is formed on the back gate region 309, and a gate electrode 311 made of polycrystalline silicon is formed on the gate silicon oxide layer 310. In this case, the source region 308S and the drain region 308D are in self-alignment with the gate electrode 311. Also, when a voltage is applied to the gate electrode 311, a channel is generated in the back gate region 309.

A power supply voltage $V_{DD}$ is applied to the source region 304S of the P-channel transistor, and the ground voltage is applied to the source region 308S of the N-channel transistor. Also, the drain region 304D of the N-channel transistor is connected to the drain region 308D of the N-channel transistor.

The back gate region 305 of the P-channel transistor and the back gate region 309 of the N-channel transistor are connected to a bias voltage generating circuit 312 which receives an active mode signal ACT.

In a standby mode (ACT="0"), the bias voltage generating circuit 312 causes the voltage $V_{subp}$ of the back gate region 305 of the P-channel transistor to be $V_{DD}$ such as 2V, thus increasing the absolute value of the threshold voltage $V_{thp}$ thereof. For example, $V_{subp}$=2V, then $V_{thp}$=-0.5V. On the other hand, in an active mode (ACT="1"), the bias voltage generating circuit 312 causes the voltage $V_{subp}$ of the back gate region 305 of the P-channel transistor to be a voltage $V_1$ lower than $V_{DD}$ and higher than $V_{DD}-V_F$, thus decreasing the absolute value of the threshold voltage $V_{thp}$ thereof. For example, $V_{subp}$=1.5V, then $V_{thp}$=-0.2V.

Similarly, in a standby mode (ACT="0"), the bias voltage generating circuit 312 causes the voltage $V_{subn}$ of the back gate region 309 of the N-channel transistor to be GND (=0 Volts), thus increasing the threshold voltage $V_{thn}$ thereof. For example, $V_{thn}$=0.5V. On the other hand, in an active mode (ACT="1"), the bias voltage generating circuit 312 causes the voltage $V_{subn}$ of the back gate region 309 of the N-channel transistor to be a voltage $V_2$ higher than 0 Volts and lower than $V_F$, thus decreasing the threshold voltage $V_{thn}$ thereof. For example, $V_{thn}$=0.2V.

Thus, in a standby mode, the absolute values of the threshold voltages are increased so as to decrease the sub threshold currents, thus decreasing the power dissipation. On the other hand, in an active mode, the absolute values of the threshold voltages are decreased so as to increase the operation speed.

In FIG. 4, since the P-channel transistor and the N-channel transistor are electrically isolated from the substrate 301 by the buried silicon oxide layer 302, a short-circuit is never generated between the transistors and the substrate 301, even when $V_1$ or $V_2$ is applied to the back gate region 305 or 309.

Also, since a parasitic capacitance is hardly generated between the back gate region 305 or 309 and the substrate 301, the parasitic capacitance between the back gate region 305 or 309 and its neighborhood can be remarkably reduced. Therefore, a transition time from a standby mode to an active mode or vice versa by changing the threshold voltages of the transistors can be reduced.

The semiconductor device of FIG. 4 is applied to a logic circuit as illustrated in FIG. 5. In FIG. 5, a CMOS inverter is formed by a P-channel MOS transistor 501 and an N-channel MOS transistor 502, and a two-input CMOS NAND circuit is formed by P-channel MOS transistors 503 and 504 and N-channel MOS transistors 505 and 506. The voltage $V_{subp}$ of the back gate regions of the P-channel transistors 501, 503 and 504 and the voltage $V_{subn}$ of the back gate regions of the N-channel transistors 502, 505 and 506 are controlled by a bias voltage generating circuit 507 which receives an active mode signal ACT.

Figure 6:
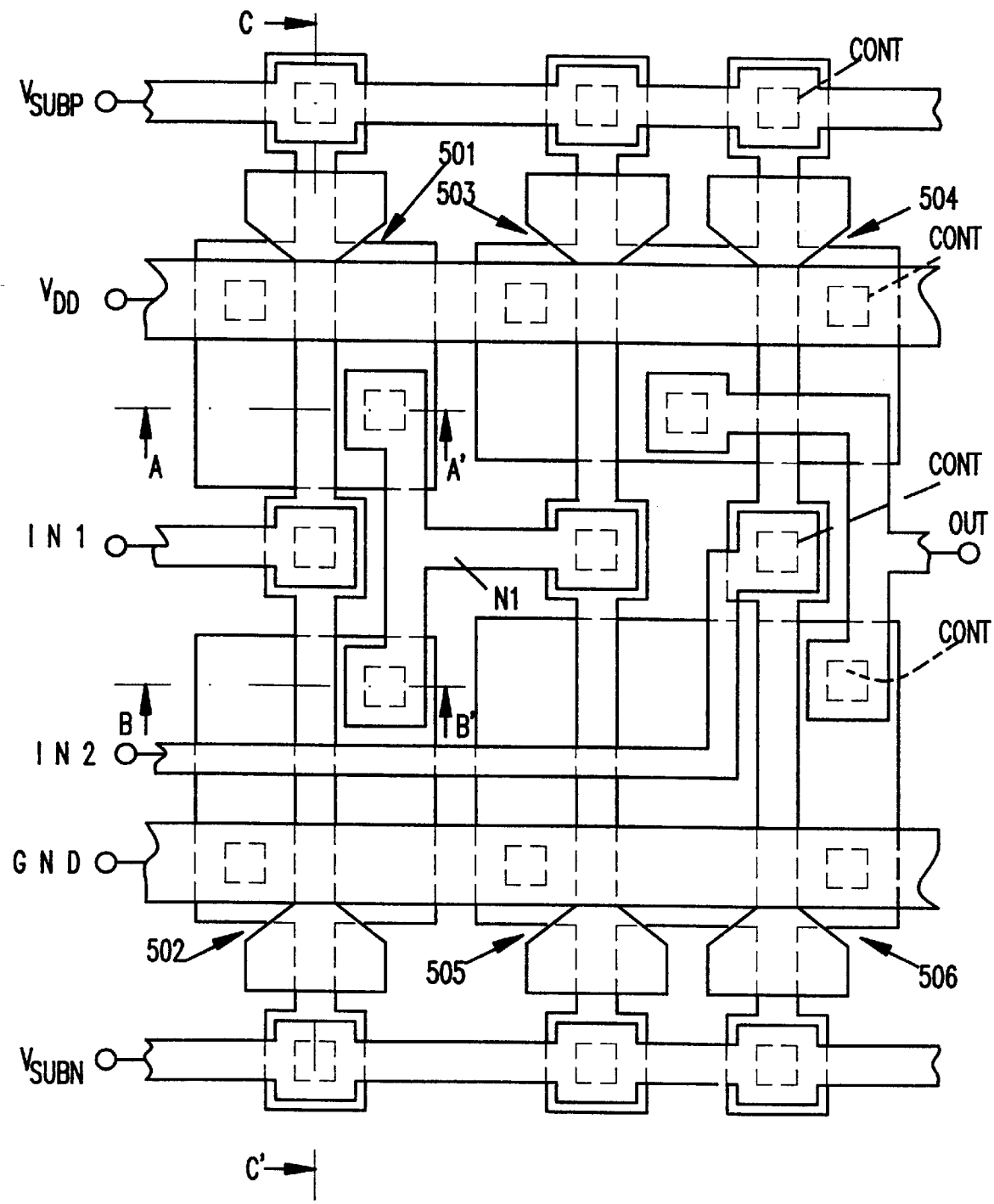
FIG. 6 is a plan view of the logic circuit of FIG. 5.
Figure 7A:
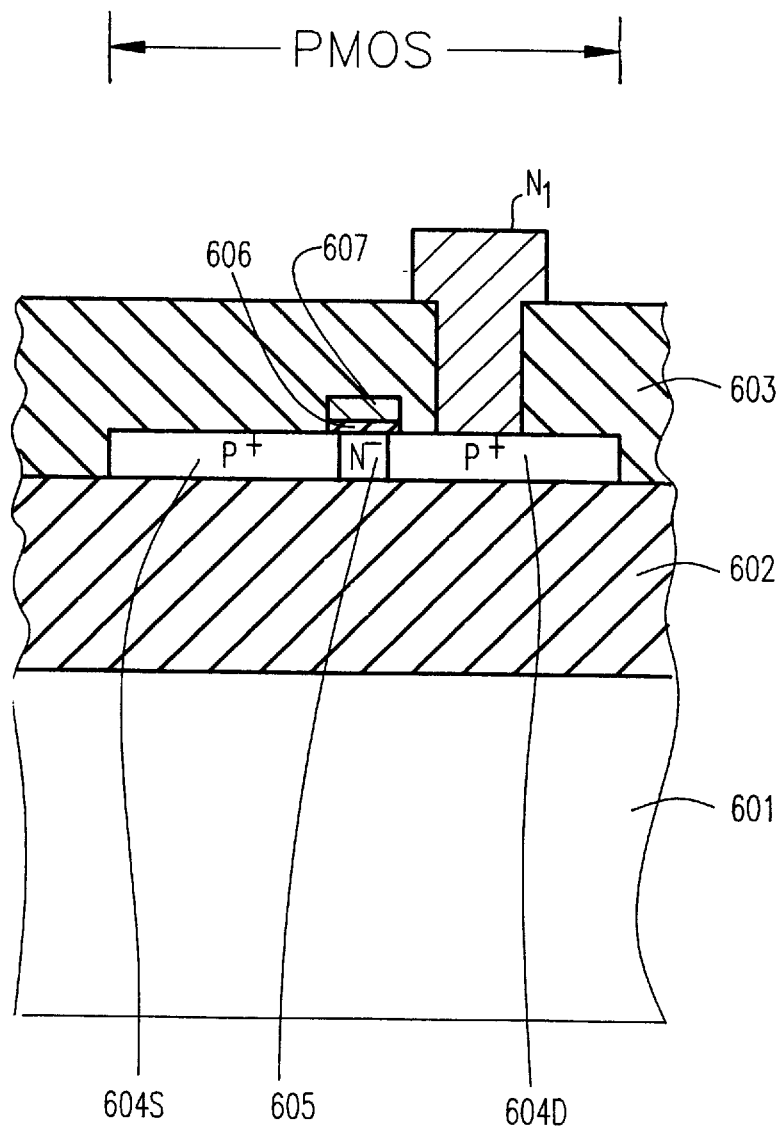
FIGS. 7A, 7B and 7C are cross-sectional views taken along the lines A–A', B–B' and C–C', respectively, of FIG. 6.
Figure 7B:
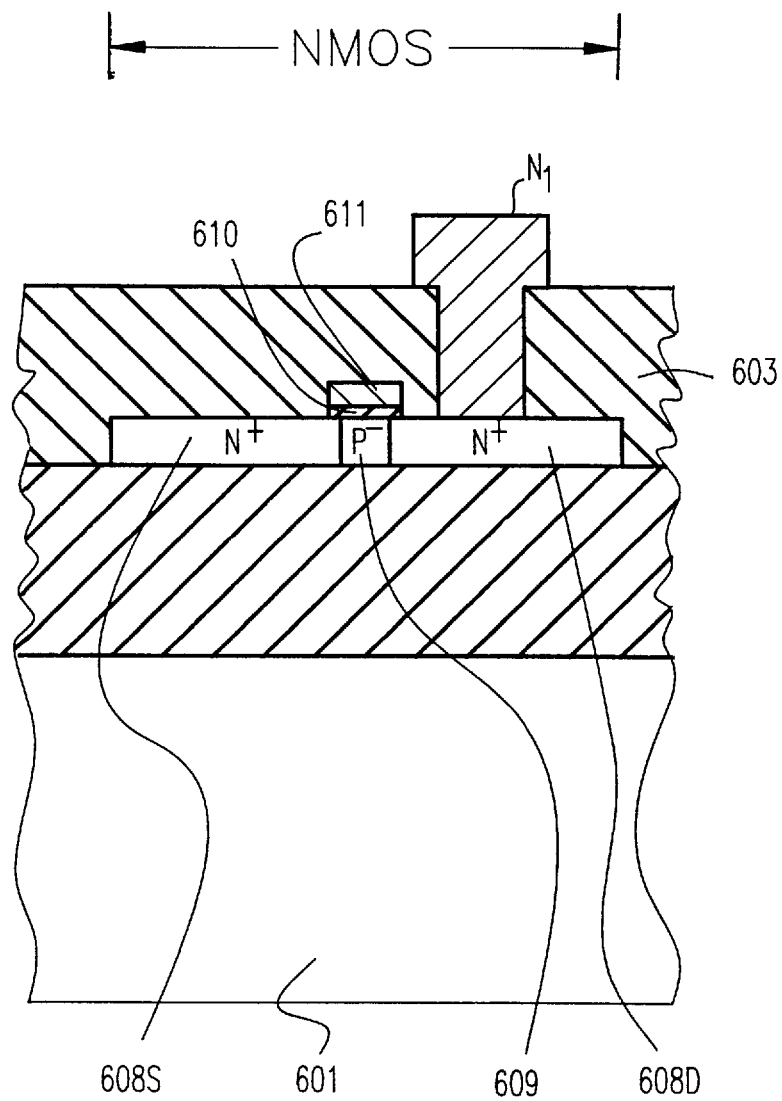
Figure 7C:
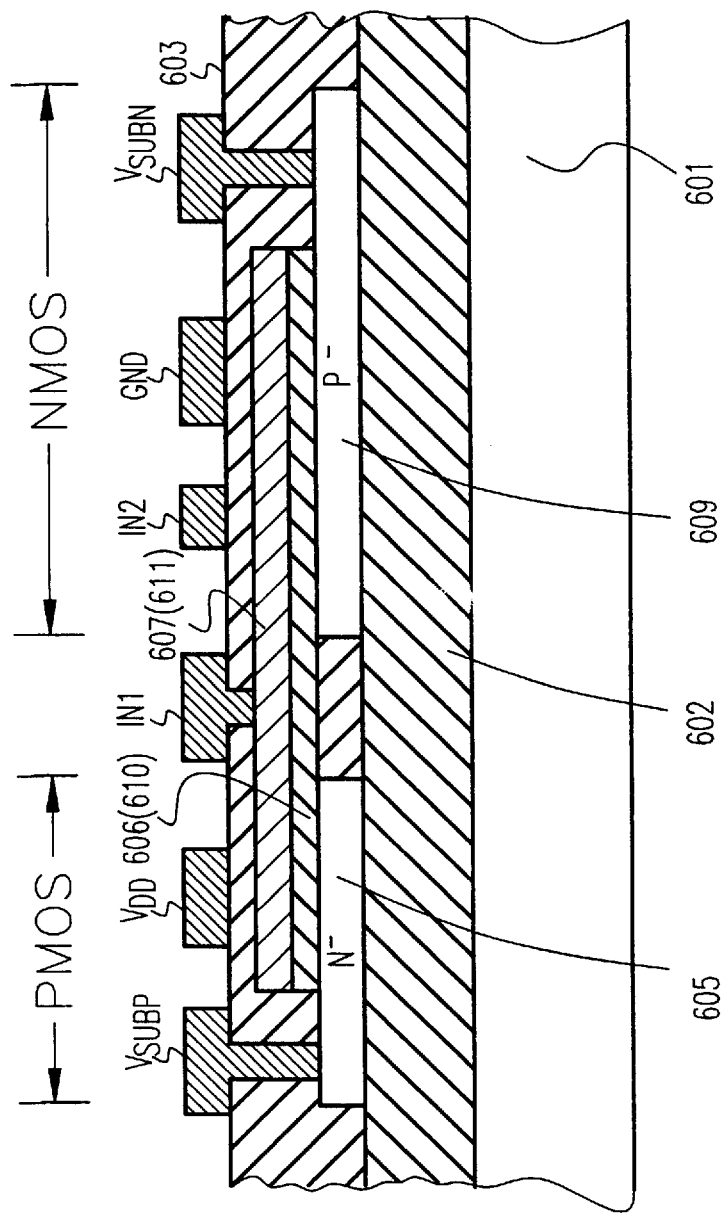

FIG. 6 is a plan view of the circuit of FIG. 5, FIG. 7A is a cross-sectional view taken along the line A–A' of the P-channel transistor 501 of FIG. 6, FIG. 7B is a cross-sectional view taken along the line B–B' of the N-channel transistor 502 of FIG. 6, and FIG. 7C is a cross-sectional view taken along the line C–C' of the P-channel transistor 501 and the N-channel transistor 502 of FIG. 6.

In FIG. 6, 7A, 7B and 7C, reference numeral 601 designates a monocrystalline silicon substrate having a buried silicon oxide 601 thereon. Also, a monocrystalline silicon layer for P-channel MOS transistors and a monocrystalline silicon layer for N-channel MOS transistors are formed on the buried silicon oxide layer 602 and are electrically isolated from each other by a silicon oxide layer 603. This configuration is formed by using SIMOX technology.

In the monocrystalline silicon layer for the P-channel MOS transistor 501 as illustrated in FIGS. 7A and 7C, a $P^+$-type impurity source region 604S, a $P^+$-type impurity drain region 604D and a $N^-$-type back gate region 605 therebetween are formed. Also, a gate silicon oxide layer 606 is formed on the back gate region 605, and a gate electrode 607 made of polycrystalline silicon is formed on the gate silicon oxide layer 606. In this case, the source region 604S and the drain region 604D are in self-alignment with the gate electrode 607.

In the monocrystalline silicon layer for the N-channel MOS transistor 502 as illustrated in FIGS. 7B and 7C, an $N^+$-type impurity source region 608S, an $N^+$-type impurity drain region 608D and a $P^-$-type back gate region 609 therebetween are formed. Also, a gate silicon oxide layer 610 is formed on the back gate region 609, and a gate electrode 611 made of polycrystalline silicon is formed on the gate silicon oxide layer 610. In this case, the source region 608S and the drain region 608D are in self-alignment with the gate electrode 611.

Also, in FIGS. 6, 7A, 7B and 7C, aluminum layers for input terminals IN1, IN2, the power supply voltage $V_{DD}$, the ground voltage GND, the back gate voltage $V_{subp}$ and $V_{subn}$, a node $N_1$ and an output terminal OUT are formed and are connected by contact holes CONT to the semiconductor layers. The contact configuration between the aluminum layers and the semiconductor layer such as the back gate regions 605 and 609 are disclosed in Stephen A. Parke et al., "Bipolar-FET Hybrid-Mode Operation of Quarter-Micrometer SOIFET's". IEEE Electron Device Letters, Vol. 14, No. 5, pp. 234–236, May 1993.

Thus, the back gate region 605 for the P-channel transistor is in contact with the buried silicon oxide layer 602 and is surrounded by the source region 604S and the drain region 604D, so that the back gate region 606 can be reduced in size. As a result, the parasitic capacitance of the back gate region 605 can be decreased.

Similarly, the back gate region 609 for the N-channel transistor is in contact with the buried silicon oxide layer 602 and is surrounded by the source region 608S and the drain region 608D, so that the back gate region 609 can be reduced in size. As a result, the parasitic capacitance of the back gate region 609 can be decreased.

Assume that the device as illustrated in FIG. 4 is applied to a semiconductor device comprised of 100000 gates under 0.35 μm design rule. Then, the entire substantial capacitance of the $N^-$-type back gate regions or the $P^-$-type back gate regions is 1000 pF. Thus, the device can be reduced by $\frac{1}{20}$ times as compared with the prior art, and a transition time can be also reduced by $\frac{1}{20}$.

Also, in FIGS. 4, 6, 7A, 7B and 7C, the back gate regions 305, 309, 605 and 609 are preferably approximately 30 nm to 200 nm thick. That is, if the thickness of the back gate regions 305, 309, 605 and 609 is smaller than 30 nm, the resistance thereof is remarkably increased to increase a charging and discharging time for the back gate regions, even when the parasitic capacitances can be decreased. On the other hand, if the thickness of the back gate regions 305, 309, 605 and 609 is larger than 200 nm, the thickness of the impurity regions 304S, 304D, 308S, 308D, 604S, 604D, 608S and 608D is also thick, so that the impurity regions expand along the horizontal direction. This is disadvantageous in the short-channel of the MOS transistors.

Figure 8:
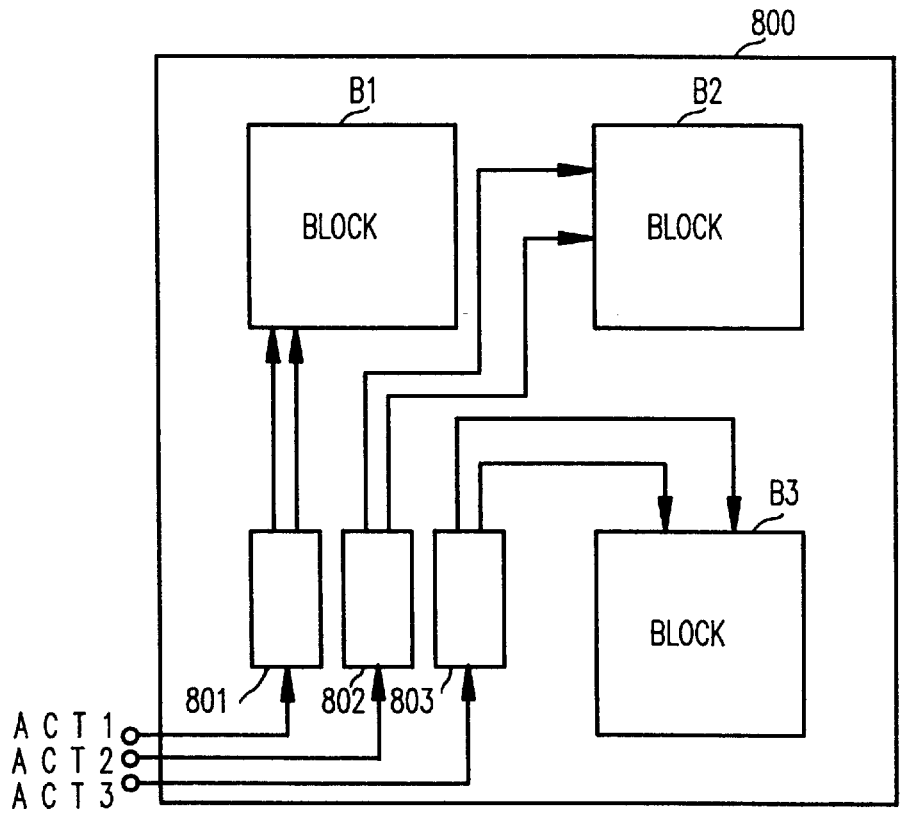
FIG. 8 is a layout diagram illustrating a second embodiment of the SOI-type semiconductor device according to the present invention.
Figure 9A:
FIGS. 9A, 9B and 9C are timing diagrams for explaining the operation of the device of FIG. 8.
Figure 9B:
Figure 9C:

In FIG. 8, which illustrates a second embodiment of the present invention, a semiconductor chip 800 is comprised of a plurality of blocks $B_1$, $B_2$ and $B_3$ each having P-channel MOS transistors and N-channel MOS transistors which have a similar configuration to those of FIG. 4. Each of the blocks $B_1$, $B_2$ and $B_3$ is connected to bias voltage generating circuits 801, 802 and 803, respectively, which receive active mode signals ACT1, ACT2 and ACT3, respectively. As a result, the switching control from a standby mode to an active mode or vice versa is individually performed upon the blocks $B_1$, $B_2$ and $B_3$ as shown in FIGS. 9A, 9B and 9C, thus further reducing the power dissipation.

Figure 10:
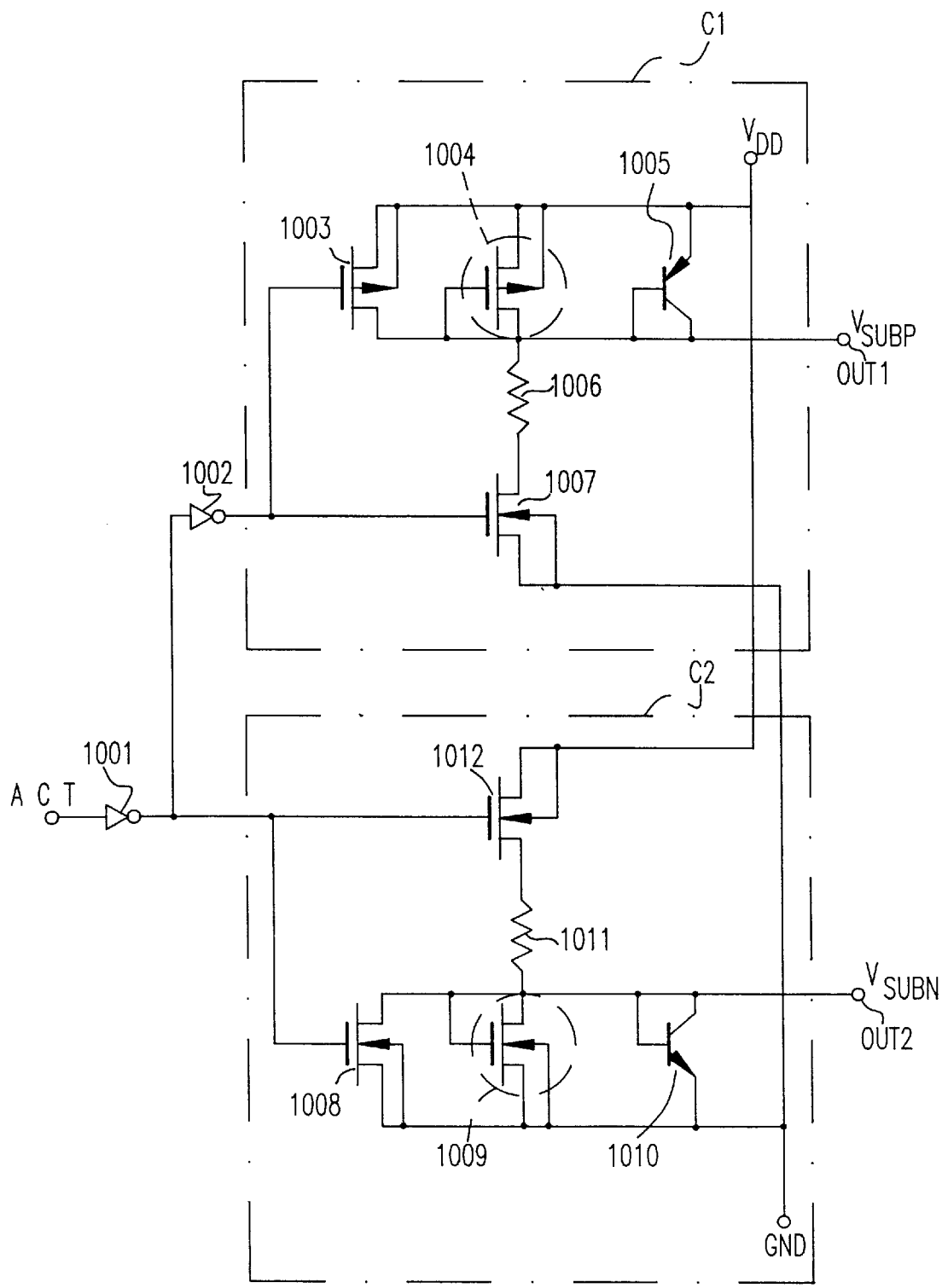
FIG. 10 is a circuit diagram illustrating a first example of the bias voltage generating circuit of FIGS. 4, 5 and 8.

In FIG. 10, which illustrates a first example of the bias voltage generating circuit of FIGS. 4, 5 and 8, an active mode signal ACT is supplied via two inverters 1001 and 1002 to a circuit C1 for generating the back gate voltage $V_{subp}$ for the P-channel transistors, and the active mode signal ACT is supplied via the inverter 1001 to a circuit C2 for generating the back gate voltage $V_{subn}$ for the N-channel transistors. That is, the circuit C1 is operated in accordance with the active mode signal ACT, and the circuit C2 is operated in accordance with an inverted signal of the active mode signal ACT.

The circuit C1 includes P-channel MOS transistors 1003 and 1004, and a PNP-type transistor 1005 in parallel between the power supply terminal $V_{DD}$ and an output terminal OUT1. In this case, the absolute value of the threshold voltage $V_{thp}'$ of the transistor 1004 is smaller than the forward voltage $V_F$ of the PNP-type transistor 1005, i.e., the forward voltage (unbiased potential barrier) of a PN junction thereof. Also, since the gate of the MOS transistor 1004 is connected to the drain thereof, the MOS transistor 1004 serves as a diode. Further, since the base of the PNP-type transistor 1005 is connected to the collector thereof, the PNP-type transistor 1005 also serves as a diode.

In addition, the circuit C1 includes a resistor 1006 and an N-channel MOS transistor 1007 in series between the output terminal OUT1 and the ground voltage terminal GND. Note that the resistor 1006 can be connected between the source of the MOS transistor 1007 and the ground voltage terminal GND, or the resistor 1006 can be included in the ON resistance of the MOS transistor 1007.

In the circuit C1, when the control is in a standby mode (ACT="0"), the transistors 1003 and 1007 are turned ON and OFF, respectively, so that the back gate voltage $V_{subp}$ at the output terminal OUT1 is $$V_{subp} = V_{DD} \tag{1}$$

Figure 11:
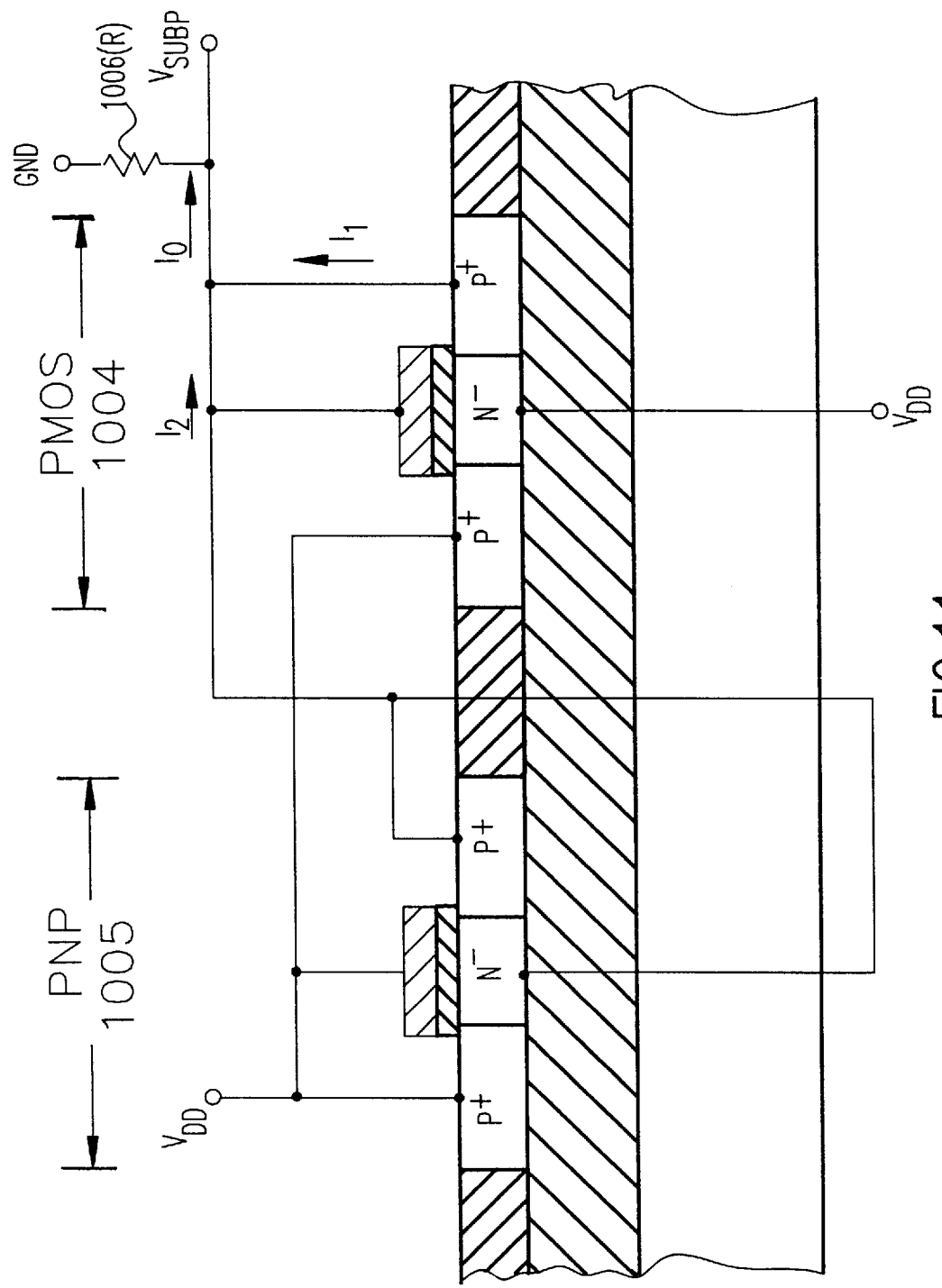
FIG. 11 is a cross-sectional view of the P-channel MOS transistor and the PNP type transistor of FIG. 10.
Figure 12:
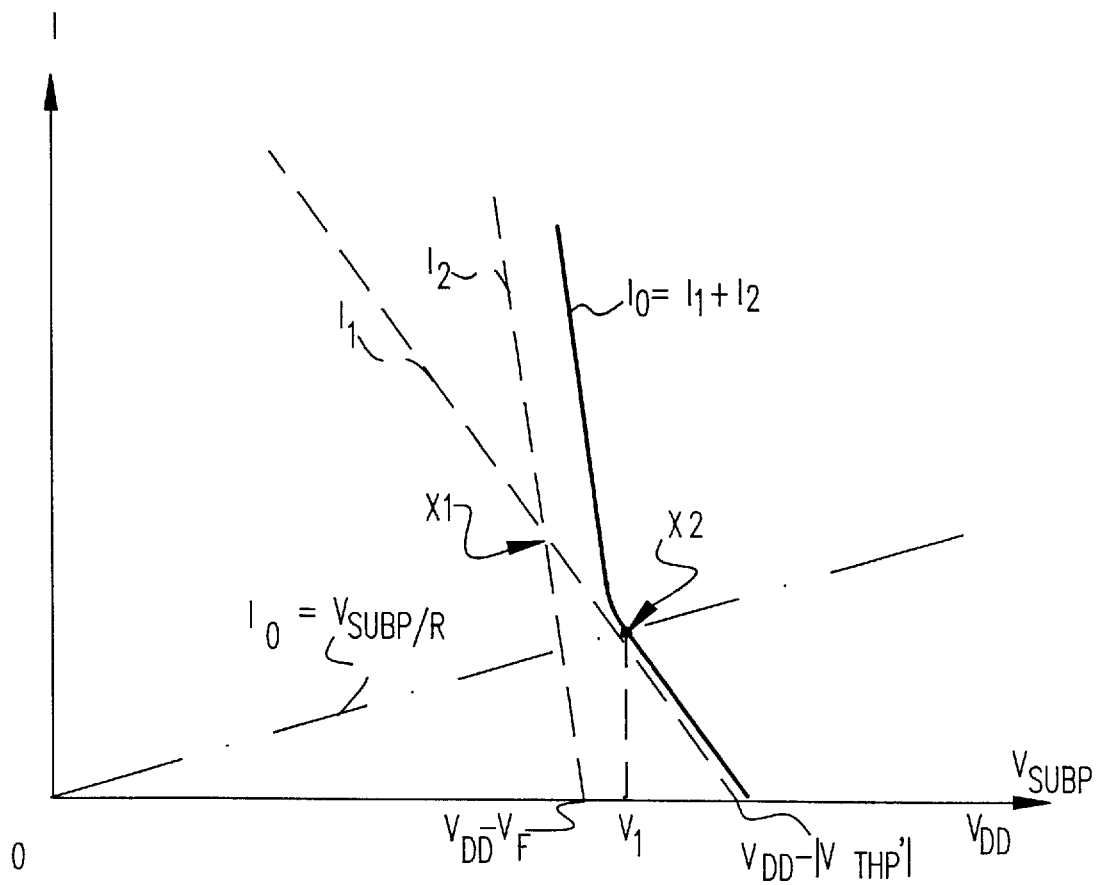
FIG. 12 is a graph showing the V-I characteristics of the circuit of FIG. 11.

In the circuit C1, when the control is in an active mode (ACT="1"), the transistors 1003 and 1007 are turned OFF and ON, respectively, so that the back gate voltage $V_{subp}$ is dependent upon the MOS transistor 1004 and the PNP-type transistor 1005. Note that, as illustrated in FIG. 11, the MOS transistor 1004 and the PNP-type transistor 1005 are manufactured in an SOI configuration similar to that in FIG. 4. In this case, the following formula is satisfied:

$$I_0 = I_1 + I_2 \quad (2)$$

where $I_0$ is a current flowing through the resistor 1006 and the MOS transistor 1007;

$I_1$ is a current flowing through the MOS transistor 1004; and $I_2$ is a current flowing through the PNP-type transistor 1005. As shown in FIG. 12, the absolute value of the threshold voltage $V_{thp}'$ of the MOS transistor 1004 is smaller than the forward voltage $V_F$ of the PN junction of the PNP-type transistor 1005. Also, the slope of the V-I characteristics of the PNP transistor 1005 is steeper than that of the MOS transistor 1004. Therefore, the curve $I_1$ crosses the curve $I_2$ at a point X1. Therefore, the total current $I_0$ is steeper when the total current $I_0$ is larger. On the other hand, if the value of the resistor 1006 is R, the following formula is satisfied:

$$I_0 = V_{subp}/R \quad (3)$$

Therefore, if R is sufficiently large, the curve $I_0$ ($=I_1+I_2$) crosses the line $I_0$ ($=V_{subp}/R$) at a point X2. As a result, the back gate voltage $V_{subp}$ satisfies $$V_{DD} - V_F < V_{subp} = V_1 < V_{DD} \quad (4)$$

Thus, when the control is transferred from a standby mode to an active mode, the circuit C1 promptly reaches the point X2 due to the fast operation of the PNP-type transistor 1005.

The circuit C2 includes N-channel MOS transistors 1008 and 1009, and an NPN-type transistor 1010 in parallel between an output terminal OUT2 and the ground voltage terminal GND. In this case, the absolute value of the threshold voltage $V_{thn}'$ of the transistor 1009 is smaller than the forward voltage $V_F$ of the NPN-type transistor 1010, i.e., a forward voltage of a PN junction thereof. Also, since the gate of the MOS transistor 1009 is connected to the drain thereof, the MOS transistor 1009 serves as a diode. Further, since the base of the NPN-type transistor 1010 is connected to the collector thereof, the PNP-type transistor 1010 also serves as a diode.

In addition, the circuit C2 includes a resistor 1011 and a P-channel MOS transistor 1012 in series between the power supply terminal $V_{DD}$ and the output terminal OUT2. Note that the resistor 1011 can be connected between the power supply terminal $V_{DD}$ and the source of the MOS transistor 1012, or the resistor 1011 can be included in the ON resistance of the MOS transistor 1012.

In the circuit C2, when the control is in a standby mode (ACT="0"), the transistors 1008 and 1012 are turned ON and OFF, respectively, so that the back gate voltage $V_{subn}$ at the output terminal OUT2 is $$V_{subn} = 0 \quad (5)$$

Figure 13:
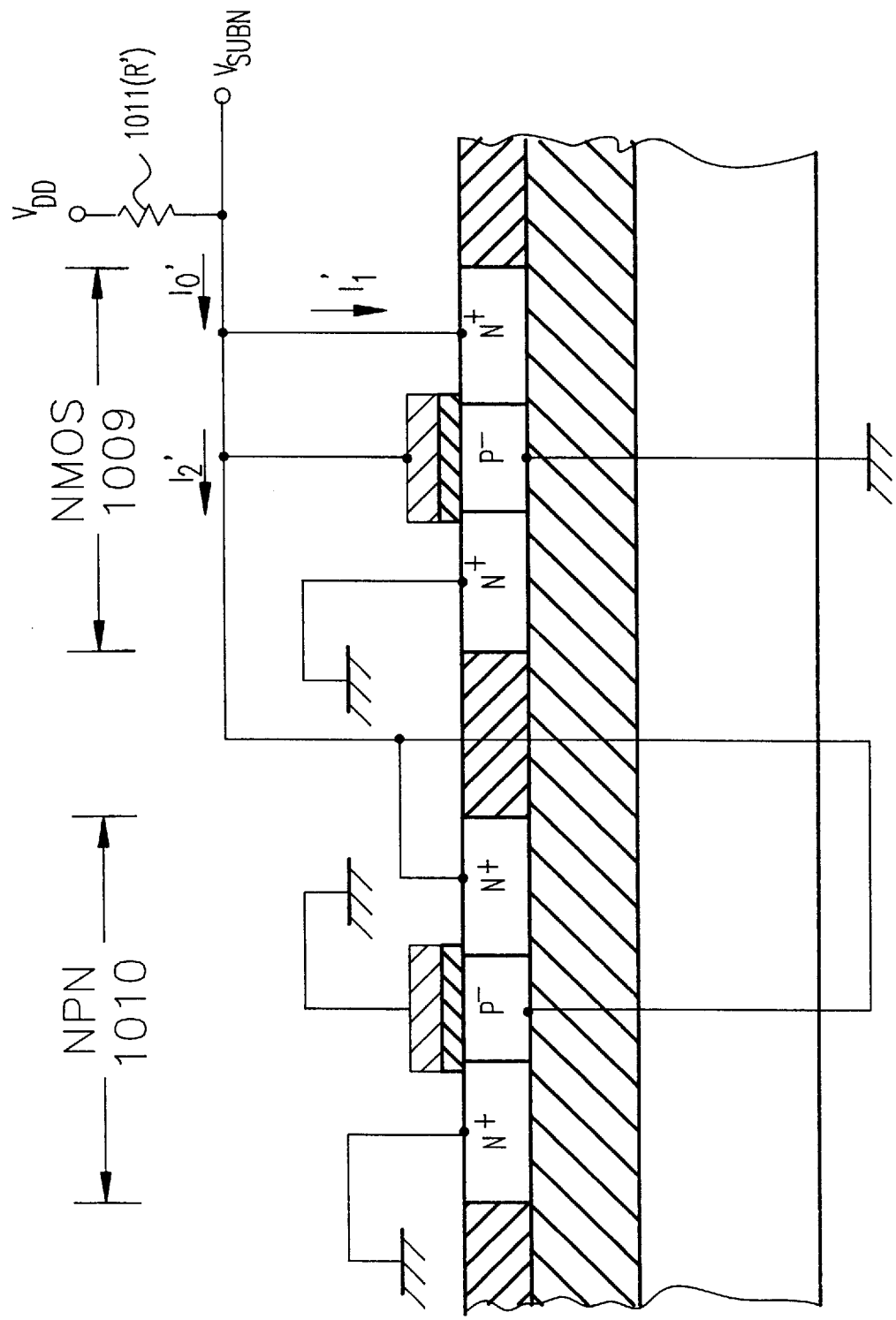
FIG. 13 is a cross-sectional view of the N-channel MOS transistor and the PNP type transistor of FIG. 10.
Figure 14:
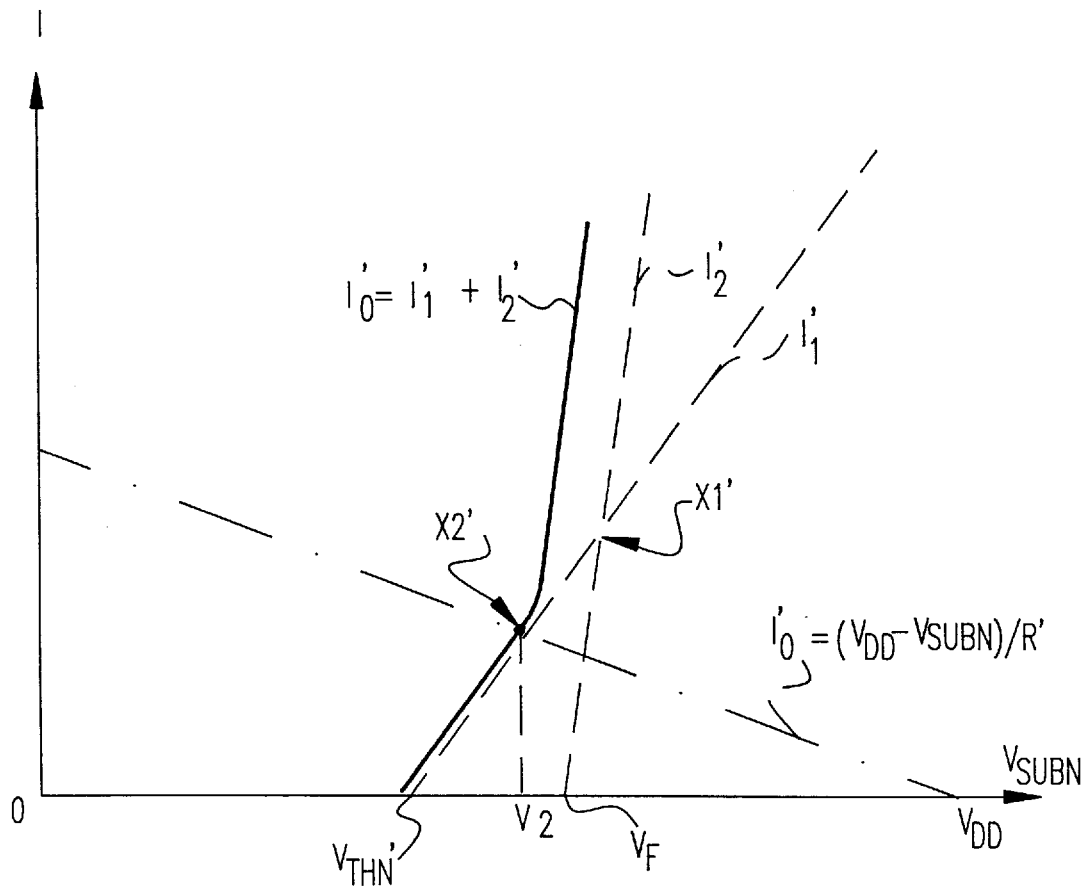
FIG. 14 is a graph showing the V-I characteristics of the circuit of FIG. 13.

In the circuit C2, when the control is in an active mode (ACT ="1"), the transistors 1008 and 1012 are turned OFF and ON, respectively, so that the back gate voltage $V_{subn}$ is dependent upon the MOS transistor 1009 and the NPN-type transistor 1010. Note that, as illustrated in FIG. 13, the MOS transistor 1009 and the NPN-type transistor 1010 are manufactured in an SOI configuration similar to that in FIG. 4. In this case, the following formula is satisfied:

$$I_0' = I_1' + I_2' \quad (6)$$

where $I_0'$ is a current flowing through the resistor 1011 and the MOS transistor 1012;

$I_1'$ is a current flowing through the MOS transistor 1009; and $I_2'$ is a current flowing through the NPN-type transistor 1010. As shown in FIG. 14, the threshold voltage $V_{thn}'$ of the MOS transistor 1009 is smaller than the forward voltage $V_F$ of the PN junction of the NPN-type transistor 1010. Also, the slope of the V-I characteristics of the NPN transistor 1010 is steeper than that of the MOS transistor 1009. Therefore, the curve $I_1'$ crosses the curve $I_2$ at a point X1'. Therefore, the total current $I_0$ is steeper when the total current $I_0$ is larger. On the other hand, if the value of the resistor 1011 is R', the following formula is satisfied:

$$I_0' = (V_{DD} - V_{subn})/R' \quad (7)$$

Therefore, if R' is sufficiently large, the curve $I_0'(=I_1+I_2)$ crosses the line $I_0'(=1/R \cdot V_{subn})$ at a point X2'. As a result, the back gate voltage $V_{subn}$ satisfies $$0 < V_{subn} = V_2 < V_F \quad (8)$$

Thus, when the control is transferred from a standby mode to an active mode, the circuit C2 promptly reaches the point X2' due to the fast operation of the NPN-type transistor 1010.

Figure 15:
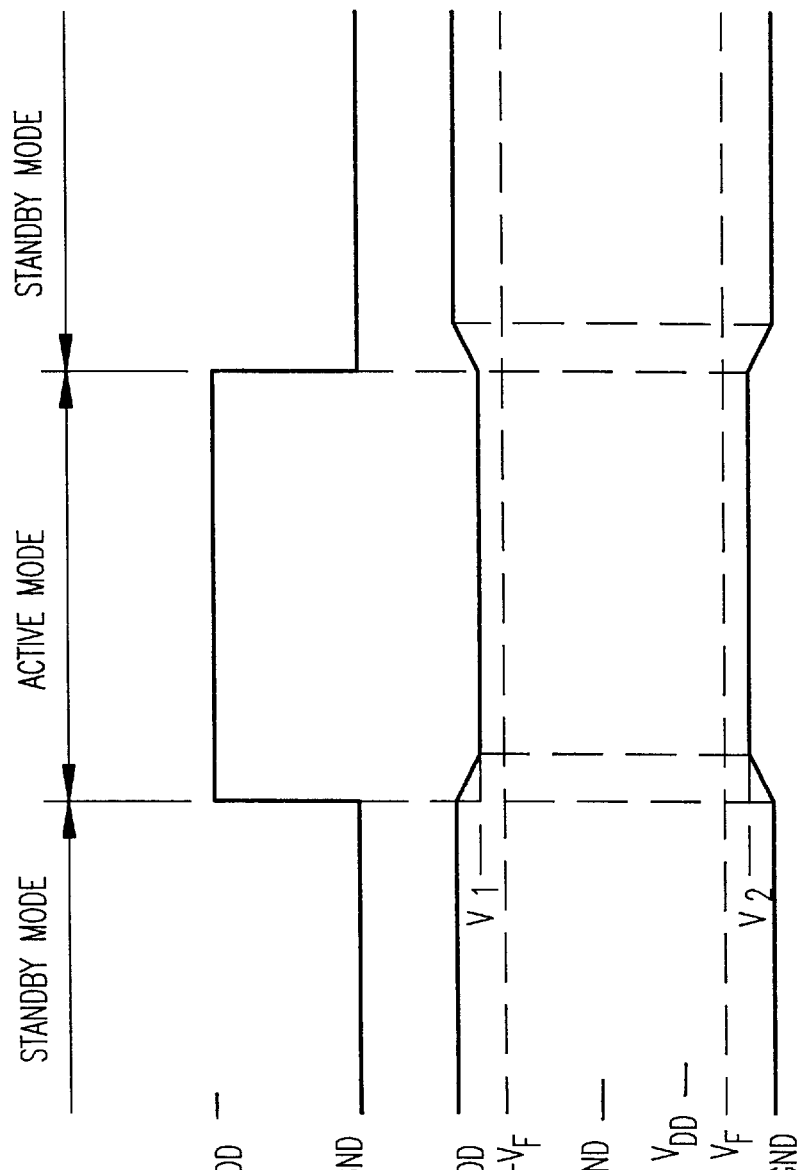
FIGS. 15A, 15B and 15C are timing diagrams for explaining the operation of the bias voltage generating circuit of FIG. 10.

Therefore, in FIG. 10, when the active mode signal ACT is changed as shown in FIG. 15A, the back gate voltage $V_{subp}$ is $V_{DD}$ (standby mode) and $V_1$ (active mode) as shown in FIG. 15B, and the back gate voltage $V_{subn}$ is 0 Volts (standby mode) and $V_2$ (active mode) as shown in FIG. 15C.

Note that the transition time from a standby mode to an active mode is determined by the resistance values of the resistors 1006 and 1011 and/or the values of the ON resistance values of the MOS transistors 1007 and 1012.

Figure 16:
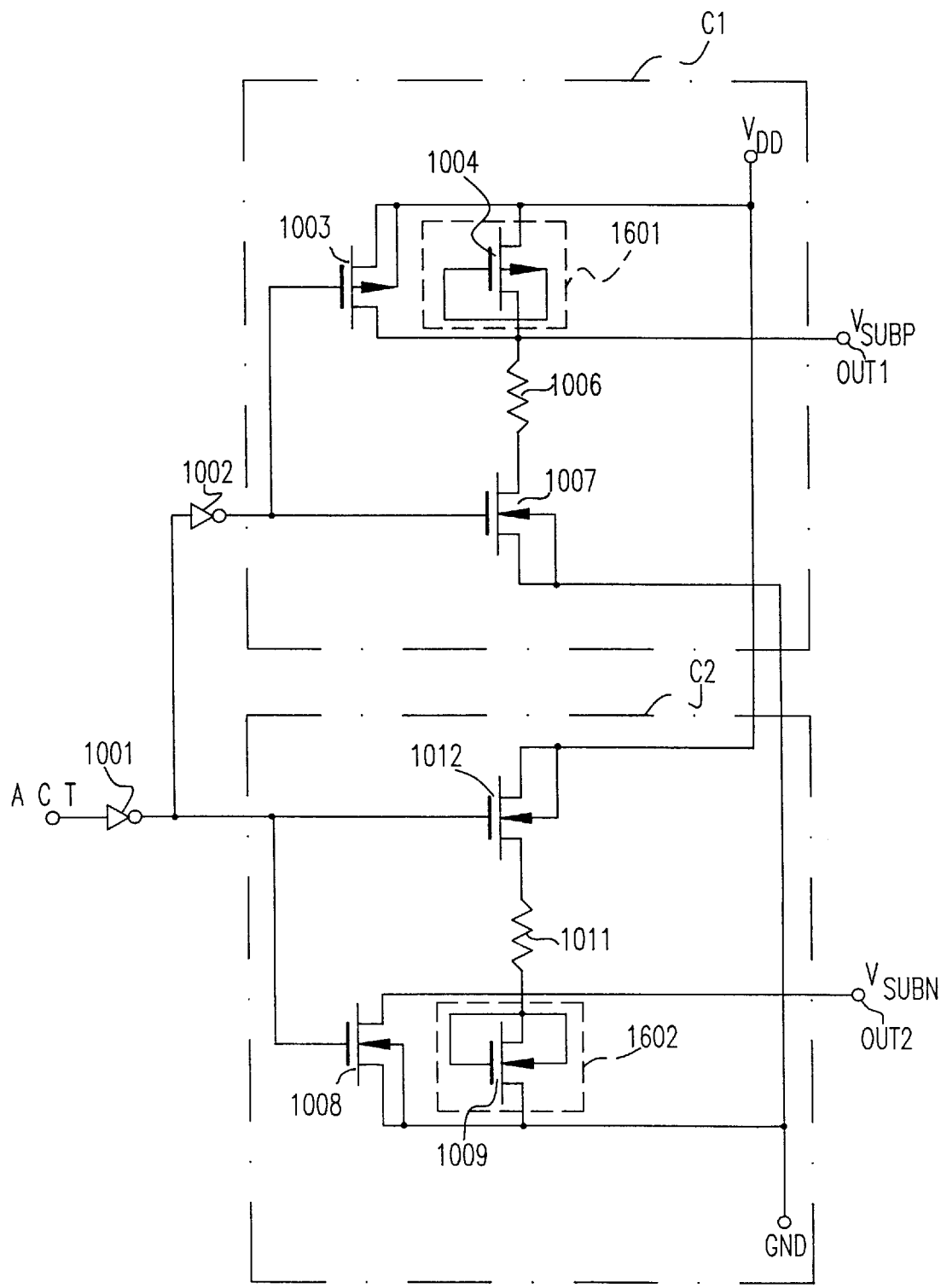
FIG. 16 is a circuit diagram illustrating a second example of the bias voltage generating circuit of FIGS. 4, 5 and 8.

In FIG. 16, which illustrates a second example of the bias voltage generating circuit of FIGS. 4, 5 and 8, a P-type hybrid mode device 1601 is provided instead of the P-channel MOS transistor 1004 and the PNP-type transistor 1005 of the circuit C1 of FIG. 10, and an N-type hybrid mode device 1602 is provided instead of the N-channel MOS transistor 1009 and the PNP-type transistor 1010 of the circuit C2 of FIG. 10. Regarding the hybrid mode transistors, reference should also be made to the abovementioned Stephen A. Parke et al. document.

Figure 17:
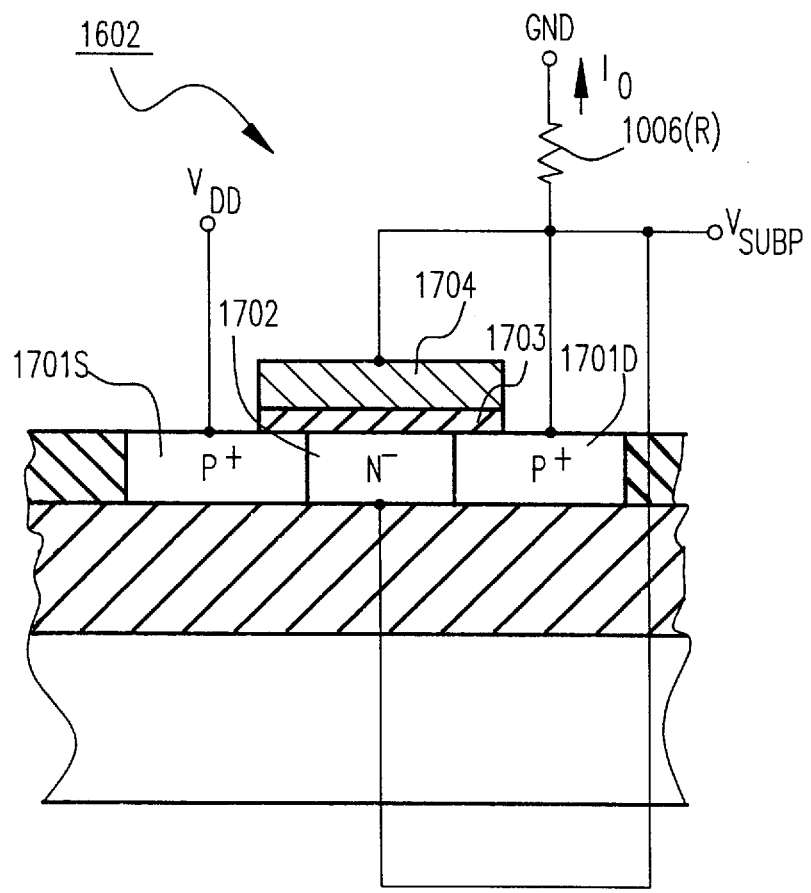
FIG. 17 is a cross-sectional view of the P-type hybrid mode device of FIG. 16.
Figure 18:
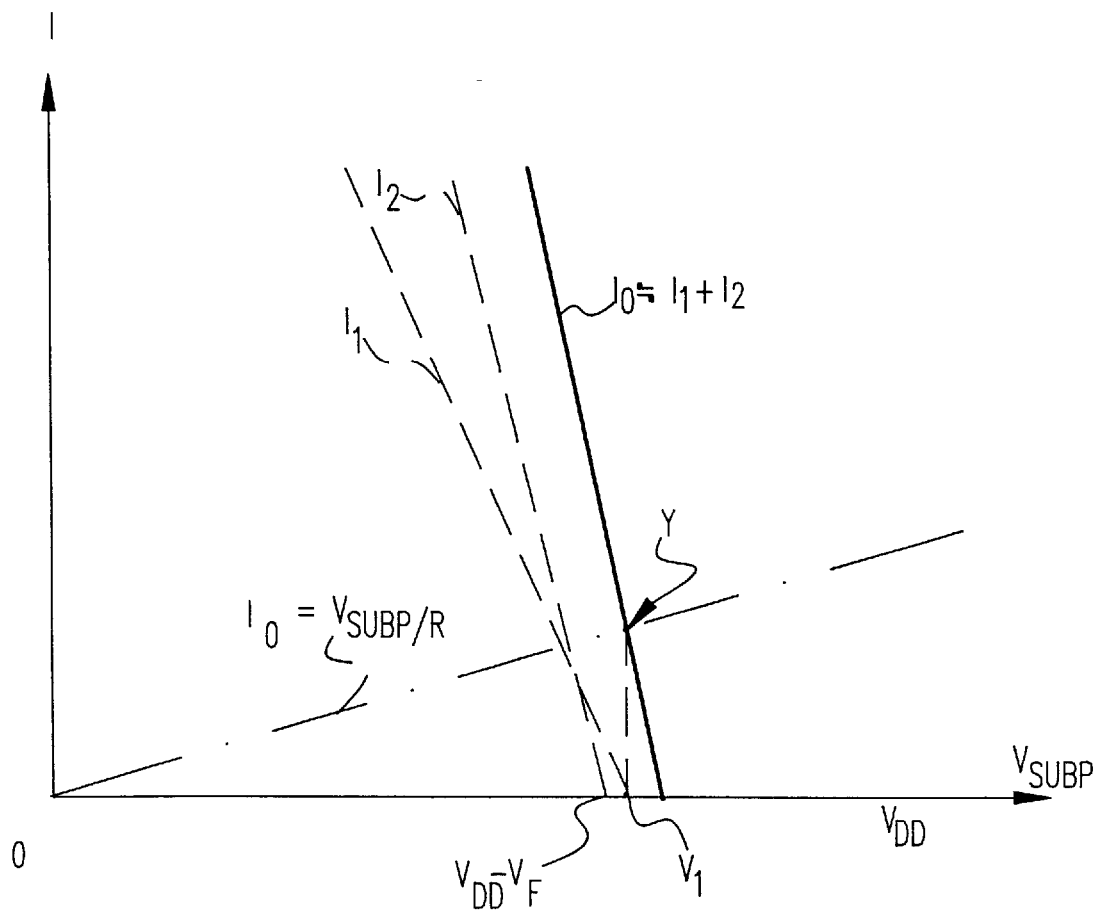
FIG. 18 is a graph showing the V-I characteristics of the P-type hybrid mode device of FIG. 17.

As illustrated in FIG. 17, the P-type hybrid mode device 1601 is manufactured in an SOI configuration similar to that in FIG. 4. The V-I characteristics of the P-type hybrid mode device 1601 are shown in FIG. 18. In FIG. 18, a current $I_1$ shows V-I characteristics when the power supply voltage $V_{DD}$ is applied to an N$^-$-type impurity region 1702 which is deemed to be separated from the back gate voltage $V_{subp}$, and $I_2$ shows V-I characteristics of a PNP-type transistor when a gate electrode 1704 is deemed to be separated from the back gate voltage $V_{subp}$. As a result, the V-I characteristics as indicated by $I_0 = I_1 + I_2$ are obtained for the P-channel hybrid mode device 1601.

In more detail, when the back gate voltage $V_{subp}$ is decreased, the voltages of the gate electrode 1704 and the N-type impurity region 1702 are decreased. In this case, a potential barrier between a P$^+$-type impurity source region 1701S and the N$^-$-type impurity region 1702 near a gate silicon oxide layer 1703 is decreased. As a result, a base-to-emitter voltage of the PNP-type transistor is larger by about 0.3V than the base-to-emitter voltage $V_{DD}-V_F$ of the V-I characteristics as indicated by $I_2$ larger. In this case, if the value of the resistor 1006 is R, the following formula is satisfied:

$$I_0 = V_{subp}/R$$

Therefore, if R is sufficiently large, the curve $I_0$ ($=I_1+I_2$) crosses the line $I_0$ ($=V_{subp}/R$) at a point Y. As a result, the back gate voltage $V_{subp}$ also satisfies:

$V_{DD}-V_F<V_{subp}=V_1<V_{DD}$

Thus, when the control is transferred from a standby mode to an active mode, the circuit C1 promptly reaches the point Y due to the fast operation of the P-channel hybrid mode device 1601.

Figure 19:
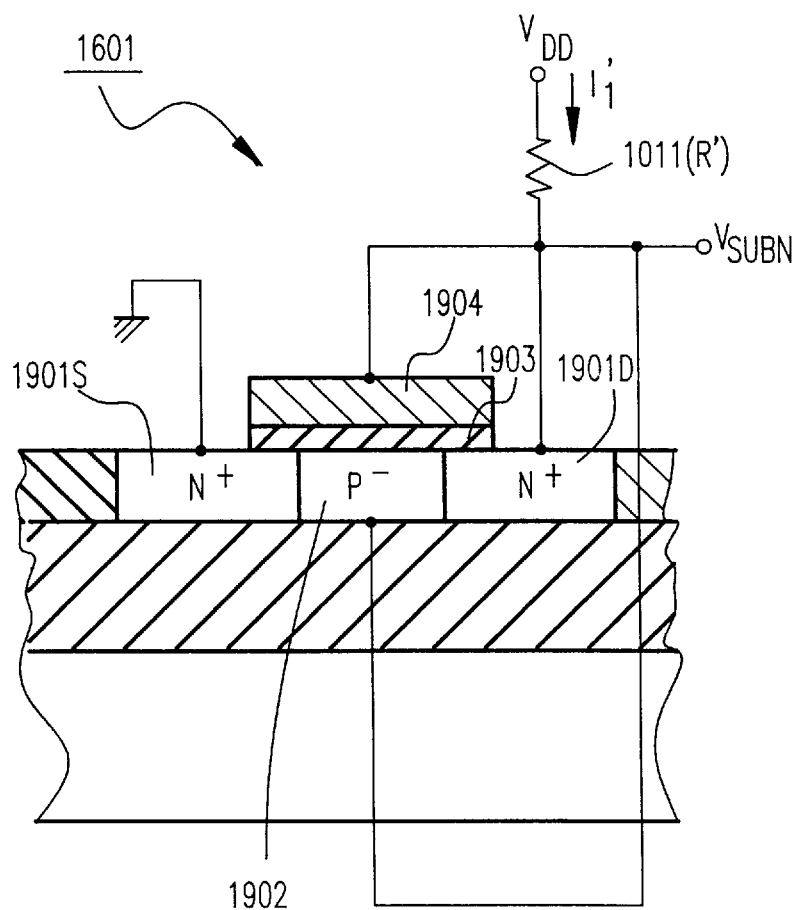
FIG. 19 is a cross-sectional view of the N-type hybrid mode device of FIG. 16.
Figure 20:
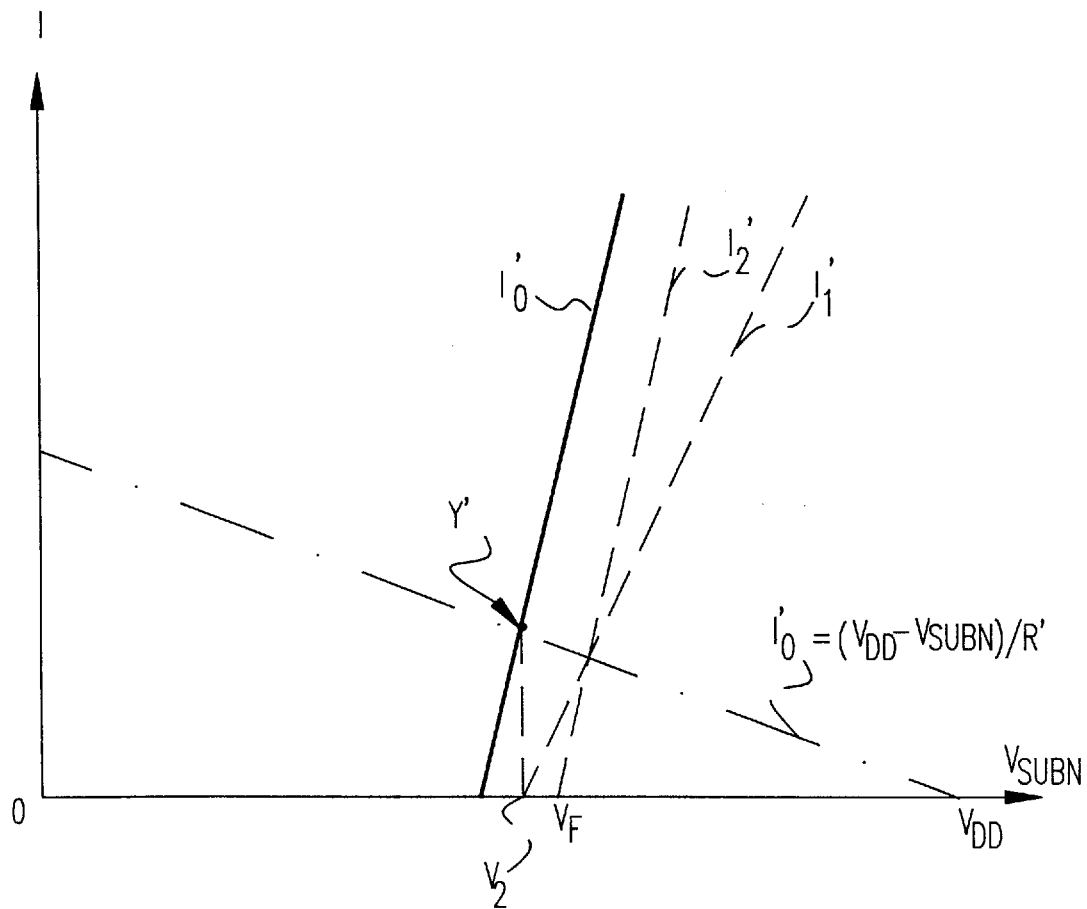
FIG. 20 is a graph showing the V-I characteristics of the N-type hybrid mode device of FIG. 19.

Similarly, as illustrated in FIG. 19, the N-type hybrid mode device 1602 is also manufactured in an SOI configuration similar to that in FIG. 4. The V-I characteristics of the N-type hybrid mode device 1602 is shown in FIG. 20. In FIG. 20, a current $I_1'$ shows V-I characteristics when the ground voltage GND is applied to a P-type impurity region 1902 which is deemed to be separated from the back gate voltage $V_{subn}$, and $I_2'$ shows V-I characteristics of an NPN-type transistor when a gate electrode 1904 is deemed to be separated from the back gate voltage $V_{subn}$. As a result, the V-I characteristics as indicated by $I_0' \doteq I_1'+I_2'$ are obtained for the N-channel hybrid mode device 1602.

In more detail, when the back gate voltage $V_{subn}$ is increased, the voltages of the gate electrode 1904 and the P⁻-type impurity region 1902 are increased. In this case, a potential barrier between an N⁺-type impurity source region 1901S and the P⁻- type impurity region 1902 near a gate silicon oxide layer 1903 is decreased. As a result, a base-to-emitter voltage of the NPN-type transistor is smaller by about 0.3V than the base-to-emitter voltage $V_F$ of the V-I characteristics as indicated by $I_2'$ being larger. In this case, if the value of the resistor 1011 is R', the following formula is satisfied:

$$I_0'=(V_{DD}-V_{subn})/R'$$

Therefore, if R' is sufficiently large, the curve $I_0'(\doteq I_1'+I_2')$ crosses the line $I_0'(=V_{DD}-V_{subn})/R')$ at a point Y'. As a result, the back gate voltage $V_{subn}$ also satisfies:

$$0<V_{subn}=V_2<V_F$$

Thus, when the control is transferred from a standby mode to an active mode, the circuit C2 promptly reaches the point Y' due to the fast operation of the N-channel hybrid mode device 1602.

Thus, the bias voltage generating circuit of FIG. 16 is advantageous in integration as compared with that of FIG. 10.

Figure 21:
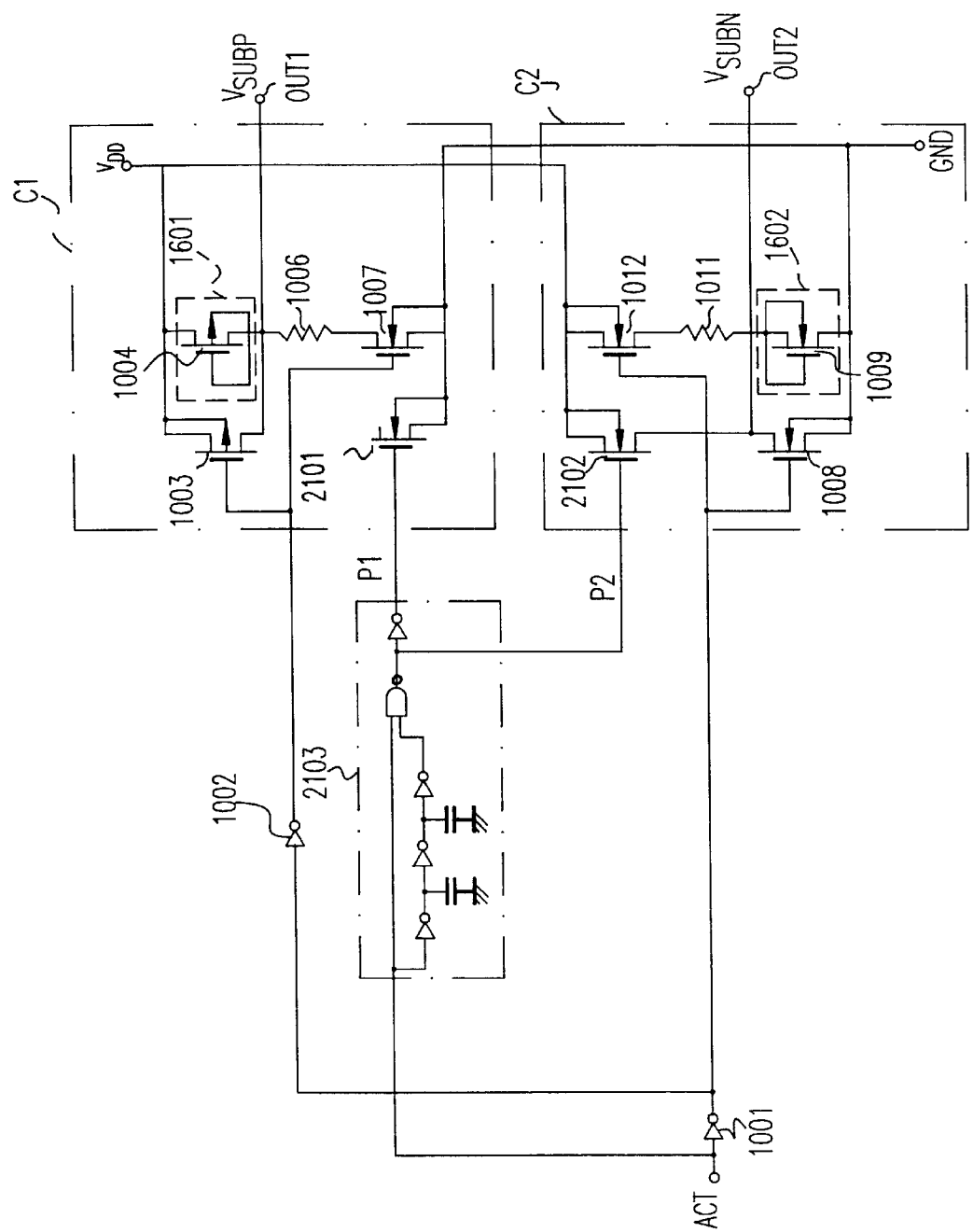
FIG. 21 is a circuit diagram illustrating a third example of the bias voltage generating circuit of FIGS. 4, 5 and 8.

In FIG. 21, which illustrates a third example of the bias voltage generating circuit of FIGS. 4, 5 and 8, an N-channel MOS transistor 2101 is added to the circuit C1 of FIG. 16, and a P-channel MOS transistor 2102 is added to the circuit C2 of FIG. 16. Also, a one-shot pulse generating circuit 2103 is added to the bias voltage generating circuit of FIG. 16.

The operation of the bias voltage generating circuit is explained with reference to FIGS. 22A through 22E.

Figure 22:
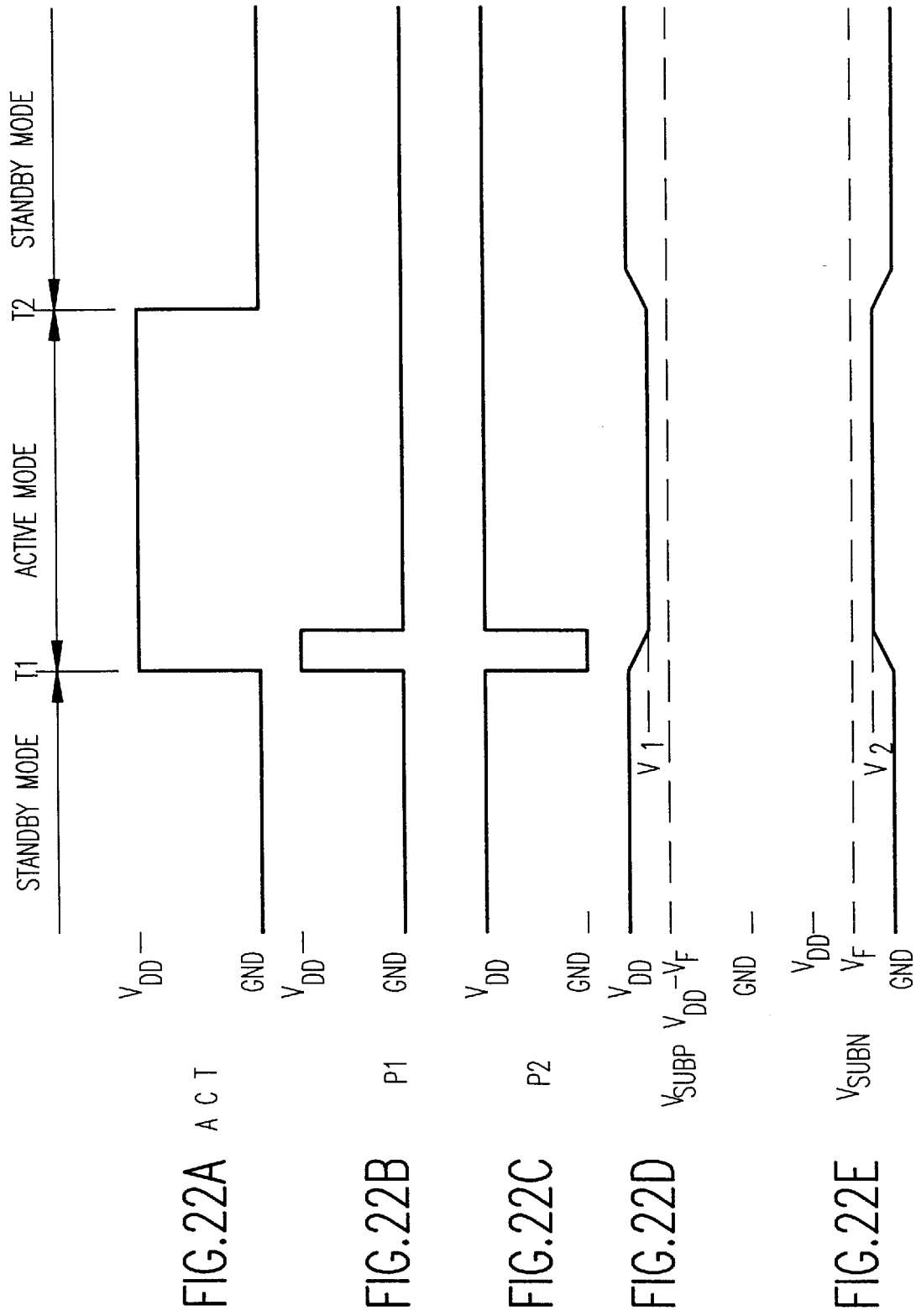
FIGS. 22A through 22E are timing diagrams for explaining the operation of the bias voltage generating circuit of FIG. 21.

In a standby mode before time $t_1$, the active mode signal ACT is low (=GND) as shown in FIG. 22A. Therefore, the MOS transistors 1003 and 1007 are turned ON and OFF, respectively. Also, output signals P1 and P2 of the one shot pulse generating circuit 2103 are low (=GND) and high (=$V_{DD}$), respectively, as shown in FIGS. 22B and 22C. Therefore, the MOS transistors 2101 and 2102 are both turned OFF. As a result, the back gate voltages $V_{subp}$ and $V_{subn}$ are $V_{DD}$ and GND, respectively, as shown in FIGS. 22D and 22E.

At time $t_1$, when the active mode signal ACT is switched from low to high (=$V_{DD}$) as shown in FIG. 22A, the one-shot pulse generating circuit 2103 generates a high level pulse signal P1 as shown in FIG. 22B, and transmits it to the MOS transistor 2101. As a result, the back gate voltage $V_{subp}$ is remarkably decreased as shown in FIG. 22D.

Simultaneously, the one-shot pulse generating circuit 2103 generates a low level pulse signal P1 as shown in FIG. 22C, and transmits it to the MOS transistor 2102. As a result, the back gate voltage $V_{subn}$ is remarkably increased as shown in FIG. 22E. Also, since the transistors 1003 and 1007 are turned OFF and ON, respectively, the back gate voltage $V_{subp}$ reaches $V_1$ determined by the ON-state P-channel hybrid device 1601, the resistor 1006 and the ON-state MOS transistor 1007. On the other hand, since the transistors 1008 and 1012 are turned OFF and ON, respectively, the back gate voltage $V_{subn}$ reaches $V_2$ determined by the ON-state P-channel hybrid device 1602, the resistor 1011 and the ON-state MOS transistor 1012.

At time $t_2$, when the active mode signal ACT is switched from high to low as shown in FIG. 22A, the one-shot pulse generating circuit 2103 does not generate any of the pulse signals P1 and P2. Therefore, since the MOS transistors 1003 and 1007 are turned ON and OFF respectively the back gate voltages $V_{subp}$ and $V_{subn}$ become $V_{DD}$ and GND, respectively, as shown in FIGS. 22D and 22E.

Thus, in the bias voltage generating circuit of FIG. 21, a transition time from a standby mode to an active mode can be reduced as compared with the bias voltage generating circuit of FIG. 16.

Figure 23:
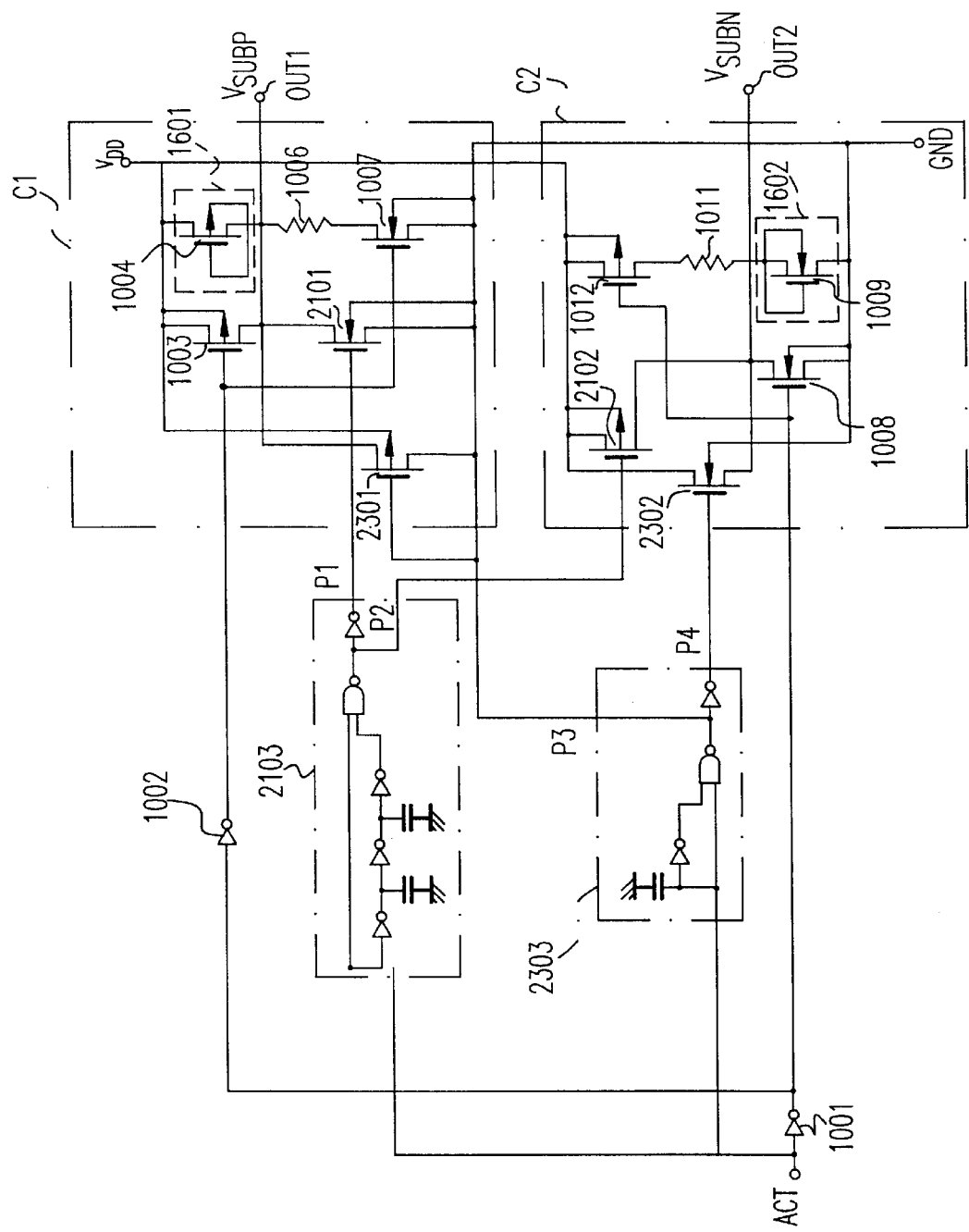
FIG. 23 is a circuit diagram illustrating a fourth example of the bias voltage generating circuit of FIGS. 4, 5 and 8.

In FIG. 23, which illustrates a fourth example of the bias voltage generating circuit of FIGS. 4, 5 and 8, a P-channel MOS transistor 2301 is added to the circuit C1 of FIG. 21, and an N-channel MOS transistor 2302 is added to the circuit C2 of FIG. 21. Also, another one-shot pulse generating circuit 2303 is added to the bias voltage generating circuit of FIG. 21. Note that the pulse width of the pulse signals generated from the one shot pulse generating circuit 2103 is larger than that of the pulse signals generated from the one shot pulse generating circuit 2303.

The operation of the bias voltage generating circuit 23 is next explained with reference to FIGS. 24A through 24G.

In a standby mode before time $t_1$, the active mode signal ACT is low (=GND) as shown in FIG. 24A. Therefore, the MOS transistors 1003 and 1007 are turned ON and OFF, respectively. Also, output signals P1 and P2 of the one shot pulse generating circuit 2103 are low and high, respectively, as shown in FIGS. 24B and 24C. Therefore, the MOS transistors 2101 and 2102 are both turned OFF. Further, also, output signals P3 and P4 of the one shot pulse generating circuit 2303 are high and low, respectively, as shown in FIGS. 24D and 24E. Therefore, the MOS transistors 2301 and 2302 are both turned OFF.

As a result, the back gate voltages $V_{subp}$ and $V_{subn}$ are $V_{DD}$ and GND, respectively, as shown in FIGS. 24F and 24G.

At time $t_1$, when the active mode signal ACT is switched from low to high as shown in FIG. 24A, the one-shot pulse generating circuit 2103 generates a high level pulse signal P1 as shown in FIG. 24B, and transmits it to the MOS transistor 2101. Simultaneously, the one-shot pulse generating circuit 2303 generates a low level pulse signal P3 as shown in FIG. 24D, and transmits it to the MOS transistor 2301. As a result, the back gate voltage $V_{subp}$ is remarkably decreased as shown in FIG. 22F, due to the two ON-state transistors 2101 and 2301.

On the other hand, the one-shot pulse generating circuit 2103 generates a low level pulse signal P1 as shown in FIG. 24C, and transmits it to the MOS transistor 2102. Simultaneously, the one-shot pulse generating circuit 2303 generates a high level pulse signal P4 as shown in FIG. 24E, and transmits it to the MOS transistor 2302. As a result, the back gate voltage $V_{subn}$ is remarkably increased as shown in FIG. 24G, due to the two ON-state transistors 2102 and 2302.

After time $t_1$ and before time $t_2$, the one-shot pulse generating circuit 2303 does not generate its output signal P3 as shown in FIG. 24D, but the one-shot pulse generating circuit 2103 continues to generate its output signal P1 as shown in FIGS. 24B. As a result, the back gate voltage $V_{subp}$ is gradually decreased due to only the ON-state transistor 2101. Simultaneously, the one-shot pulse generating circuit 2303 does not generate its output signal P4 as shown in FIG. 24E, but the one-shot pulse generating circuit 2103 continues to generate its output signal P2 as shown in FIGS. 24C. As a result, the back gate voltage $V_{subn}$ is gradually decreased due to only the ON-state transistor 2102. After time $t_3$, since the transistors 1003 and 1007 are turned OFF and ON, respectively, the back gate voltage $V_{subp}$ reaches $V_1$ determined by the ON-state P-channel hybrid device 1601, the resistor 1006 and the ON-state MOS transistor 1007. On the other hand, since the transistors 1008 and 1012 are turned OFF and ON, respectively, the back gate voltage $V_{subn}$ reaches $V_2$ determined by the ON-state P-channel hybrid device 1602, the resistor 1011 and the ON-state MOS transistor 1012.

At time $t_4$, when the active mode signal ACT is switched from high to low as shown in FIG. 24A, the one-shot pulse generating circuits 2103 and 2303 do not generate any of the pulse signals P1, P2, P3 and P4. Therefore, since the MOS transistors 1003 and 1007 are turned ON and OFF respectively the back gate voltages $V_{subp}$ and $V_{subn}$ become $V_{DD}$ and GND, respectively, as shown in FIG. 24F and 24G.

Thus, in the bias voltage generating circuit of FIG. 23, when the control is transferred from a standby mode to an active mode, it is possible to prevent the output terminal OUT1 from being overdischarged and the output terminal OUT2 from being overcharged.

In FIG. 23, the driving capability of the MOS transistor 2301 (2302) is preferably larger than that of the MOS transistor 2101 (2301), to further improve the controllability or the convergence of the back gate voltages $V_{subp}$ and $V_{subn}$.

As explained hereinbefore, according to the present invention, since the transistors are electrically isolated from a substrate, no short-circuit is generated between the transistors and the substrate. Also, since no substantial capacitance exists between the transistors and the substrate, a transition time from a standby mode to an active mode or vice versa can be reduced.

We claim:

1. A bias voltage generating apparatus, comprising:

a first power supply means for supplying first power supply voltage;

a second power supply means for supplying a second power supply voltage;

a first output terminal;

a second output terminal;

a first switching element connected between said first power supply means and said first output terminal, said first switching element being turned ON in a standby mode and being turned OFF in an active mode;

a first diode means formed by a P-channel MOS transistor and connected between said first power supply means and said first output terminal;

a second diode means formed by a PNP-type transistor and connected between said first power supply means and said first output terminal, an absolute value of a threshold voltage of said first diode means being smaller than a forward voltage of said second diode means;

a switching element connected between said first output terminal and said second power supply means, said second switching element being turned OFF in said standby mode and being turned ON in said active mode;

a third switching element connected between said second output terminal and said second power supply means, said third switching element being turned ON in said standby mode and being turned OFF in said active mode;

a third diode means formed by an N-channel MOS transistor and connected between said second output terminal and said second power supply means;

a fourth diode means formed by an NPN-type transistor and connected between said second output terminal and said second power supply means, a threshold voltage of said third diode means being smaller than a forward voltage of said fourth diode means; and a fourth switching element connected between said first power supply means and said second output terminal, said fourth switching element being turned OFF in said standby mode and being turned ON in said active mode.

2. The apparatus as set forth in claim 1, wherein said first switching element comprises a P-channel MOS transistor operated in response to an active mode signal, said second switching element comprising an N-channel MOS transistor operated in response to said active mode signal, said third switching element comprising an N-channel MOS transistor operated in response to an inverted signal of said active mode signal, said fourth switching element comprising a P-channel MOS transistor operated in response to the inverted signal of said active mode signal.

3. The apparatus as set forth in claim 1, further comprising:

a first resistor connected in series to said second switching element between said first power supply means and said first output terminal; and a second resistor connected in series to said fourth switching element between said first power supply means and said second output terminal.

4. The apparatus as set forth in claim 1, further comprising;

a fifth switching element connected between second first output terminal and said second power supply means;

a sixth switching element connected between said first power supply means and said second output terminal; and a first one-shot pulse generating circuit for generating a first pulse signal and a second pulse signal in response to a transition from said standby mode to said active mode, said first pulse signal being transmitted to said fifth switching element to turn ON said fifth switching element, said second pulse signal being transmitted to said sixth switching element to turn ON said sixth switching element.

5. The apparatus as set forth in claim 4, wherein said fifth switching element comprises an N-channel MOS transistor, said sixth switching element comprising a P-channel MOS transistor.

6. The apparatus as set forth in claim 4, further comprising:

a seventh switching element connected between said first output terminal and said second power supply means;

an eighth switching element connected between said first power supply means and said second output terminal; and a second one-shot pulse generating circuit for generating a third pulse signal having a smaller pulse width than said first pulse signal and a fourth pulse signal having a smaller pulse width than said second pulse signal in response to a transition from said standby mode to said active mode, said third pulse signal being transmitted to said seventh switching element to turn ON said seventh switching element, said fourth pulse signal being transmitted to said eighth switching element to turn ON said eighth switching element.

7. The apparatus as set forth in claim 6, wherein said seventh switching element comprises an N-channel MOS transistor, said eighth switching element comprising a P-channel MOS transistor.

8. A bias voltage generating apparatus, comprising:

a first power supply means for supplying a first power supply voltage;

a second power supply means for supplying a second power supply voltage;

a first output terminal;

a second output terminal;

a first switching element connected between said first power supply means and said first output terminal, said first switching element being turned ON in a standby mode and being turned OFF in an active mode;

a first diode means formed by a P-channel hybrid mode device and connected between said first power supply means and said first output terminal;

a second switching element connected between said first output terminal and said second power supply means, said second switching element being turned OFF in said standby mode and being turned ON in said active mode;

a third switching element connected between said second output terminal and said second power supply means, said third switching element being turned ON in said standby mode and being turned OFF in said active mode;

a third diode means formed by an N-channel hybrid mode device and connected between said second output terminal and said second power supply mean; and a fourth switching element connected between said first power supply means and said second output terminal, said fourth switching element being turned OFF in said standby mode and being turned ON in said active mode.

9. The apparatus as set forth in claim 8, wherein said first switching element comprises a P-channel MOS transistor operated in response to an active mode signal, said second switching element comprising an N-channel MOS transistor operated in response to said active mode signal, said third switching element comprising an N-channel MOS transistor operated in response to an inverted signal of said active mode signal, said fourth switching element comprising a P-channel MOS transistor operated in response to the inverted signal of said active mode signal.

10. The apparatus as set forth in claim 8, further comprising:

a first resistor connected in series to said second switching element between said first power supply means and said first output terminal; and a second resistor connected in series to said fourth switching element between said first power supply means and said second output terminal.

11. The apparatus as set forth in claim 8, further comprising;

a fifth switching element connected between said first output terminal and said second power supply means;

a sixth switching element connected between said first power supply means and said second output terminal; and a first one-shot pulse operating circuit for generating a first pulse signal and a second pulse signal in response to a transition from said standby mode to said active mode, said first pulse signal being transmitted to said fifth switching element to turn ON said fifth switching element, said second pulse signal being transmitted to said sixth switching element to turn ON said sixth switching element.

12. The apparatus as set forth in claim 11, wherein said fifth switching element comprises an N-channel MOS transistor, said sixth switching element comprising a P-channel MOS transistor.

13. The apparatus as set forth in claim 11, further comprising;

a seventh switching element connected between said first output terminal and said second power supply means;

an eighth switching element connected between said first power supply means and said second output terminal; and a second one-shot pulse generating circuit for generating a third pulse signal having a smaller pulse width than said first pulse signal and a fourth pulse signal having a smaller pulse width than said second pulse signal in response to a transition from said standby mode to said active mode, said third pulse signal being transmitted to said seventh switching element to turn ON said seventh switching element, said fourth pulse signal being transmitted to said eighth switching element to turn ON said eighth switching element.

14. The apparatus as set forth in claim 13, wherein said seventh switching element comprises an N-channel MOS transistor, said eighth switching element comprising a P-channel MOS transistor.

* * * * *